United States Patent
D'Evelyn et al.

(10) Patent No.: US 7,053,413 B2
(45) Date of Patent: *May 30, 2006

(54) HOMOEPITAXIAL GALLIUM-NITRIDE-BASED LIGHT EMITTING DEVICE AND METHOD FOR PRODUCING

(75) Inventors: Mark Philip D'Evelyn, Niskayuna, NY (US); Nicole Andrea Evers, Niskayuna, NY (US); Steven Francis LeBoeuf, Schenectady, NY (US); Xian-An Cao, Clifton Park, NY (US); An-Ping Zhang, Niskaryuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/831,865

(22) Filed: Apr. 26, 2004

(65) Prior Publication Data

US 2004/0245535 A1    Dec. 9, 2004

Related U.S. Application Data

(60) Continuation-in-part of application No. 10/440,574, filed on May 19, 2003, which is a division of application No. 09/694,690, filed on Oct. 23, 2000.

(51) Int. Cl.
*H01L 27/15* (2006.01)
(52) U.S. Cl. .............................. 257/79; 257/86; 257/94; 257/103
(58) Field of Classification Search .................... None
See application file for complete search history.

(56) References Cited

U.S. PATENT DOCUMENTS

| | | | |
|---|---|---|---|
| 5,770,887 A | 6/1998 | Tadatomo et al. | |
| 5,810,925 A | 9/1998 | Tadatomo et al. | |
| 6,140,669 A | 10/2000 | Lozykowski et al. | |
| 6,181,721 B1* | 1/2001 | Geels et al. | 372/45.01 |
| 6,225,650 B1 | 5/2001 | Tadatomo et al. | |
| 6,255,669 B1 | 7/2001 | Birkhahn et al. | |

(Continued)

FOREIGN PATENT DOCUMENTS

WO    WO0124285    4/2001

(Continued)

OTHER PUBLICATIONS

F. Bertram et al., American Institute of Physics, Applied Physics Letters, "Strain Relaxation and Strong Impurity Incorporation in Epitaxial Laterally Overgrown GaN: Direct Imaging of Different Growth Domains By Cathodoluminescence Microscopy and Micro-Raman Spectroscopy", vol. 74, No. 3, pp. 359-361, Jun. 26, 2000.

(Continued)

*Primary Examiner*—Wai-Sing Louie
(74) *Attorney, Agent, or Firm*—William E. Powell, III; Christian G. Cabou

(57) ABSTRACT

A light emitting device, such as a light emitting diode or a laser diode. The light emitting device comprises a light emitting semiconductor active region disposed on a substrate. The substrate comprises an optical absorption coefficient below about 100 $cm^{-1}$ at wavelengths between 700 and 465 nm a GaN single crystal having a dislocation density of less than $10^4$ per $cm^2$ and an optical absorption coefficient below about 100 $cm^{-1}$ at wavelengths between 700 and 465 nm. A method of making such a light emitting device is also provided.

54 Claims, 6 Drawing Sheets

U.S. PATENT DOCUMENTS

| | | | |
|---|---|---|---|
| 6,294,440 B1* | 9/2001 | Tsuda et al. | 438/479 |
| 6,413,627 B1* | 7/2002 | Motoki et al. | 428/332 |
| 6,596,079 B1 | 7/2003 | Vaudo et al. | |
| 6,686,691 B1* | 2/2004 | Mueller et al. | 313/503 |
| 2004/0124434 A1* | 7/2004 | D'Evelyn et al. | 257/103 |

FOREIGN PATENT DOCUMENTS

| | | |
|---|---|---|
| WO | WO00137351 | 5/2001 |

OTHER PUBLICATIONS

P. Fini et al., American Institute of Physics, Applied Physics Letters, "*In Situ, Real-Time Measurement of Wing Tilt During Lateral Epitaxial Overgrowth of GaN*", vol. 76, No. 26, pp. 3893-3895, Jun. 26, 2000.

P. Fini et al., Journal of Crystal Growth, *Determination of Tilt in the Lateral Epitaxial Overgrowth of GaN Using X-Ray Diffraction*, vol. 209, pp. 581-590, 2000.

Yoshiaki Honda et al., Japan Journal of Applied Physics, "*Crystal Orientation Fluctuation of Epitaxial-Lateral-Overgrown GaN with W Mask and SiO₂ Mask Observed by Transmission Electron Diffraction and X-Ray Rocking Curves*", vol. 38, Part 2, No. 11B, pp. L1299-L1302, Nov. 15, 1999.

K. Horibuchi et al., Threading Disclocations in SAG-GaN, Phys. Stat. Sol., "*Behavior of Treading Dislocations in SAG-GaN Grown by MOVPE*", 180, pp. 171-175, 2000.

Ig-Hyeon Kim et al., American Institute of Physics, Applied Physics Letters, "*Crystal Tilting in GaN Grown By Pendoepitaxy Method on Sapphire Substrate*", vol. 75, No. 26, pp. 4109-4111, Dec. 27, 1999.

TS Kuan et al., Department of Physics, University at Albany, State University of New York, Albany, NY 12222, "*Dislocation Mechanisms In The GaN Lateral Overgrowth By Hydride Vapor Phase Epitaxy*", F99W2.6, pp. 1-6.

H. Marchand et al., American Institute of Physics, Applied Physics Letters, "*Microstructure of GaN Latgerally Overgrown By Metalorganic Chemical Vapor Deposition*", vol. 73, No. 6, pp. 747-749, Aug. 10, 1998.

Akira Sakai et al., American Institute of Physics, Applied Physics Letters, "*Transmission Electron Microscopy of Defects In GaN Films Formed By Epitaxial Lateral Overgrowth*", vol. 73, No. 4, pp. 481-483, Jul. 27, 1998.

YH Song et al., Phys. Stat. Sol., *Lateral Epitaxial Overgrowth of GaN and Its Crystallographic Tilt Depending On The Growth Condition*, 180, pp. 247-250, 2000.

S. Tomiya et al., American Institute of Physics, Applied Physics Letters, "*Dependence of Crystallographic Tilt and Defect Distribution On Mask Material In Epitaxial Lateral Overgrown GaN Layers*", vol. 77, No. 5, pp. 636-638, Jul. 31, 2000.

Chris G. Van de Walle, The American Physical Society, Rapid Communications, Physical Review B, "*Interactions of Hydrogen With Native Defects in GaN*", vol. 56, No. 16, pp. R10 020-R10 023, Oct. 15, 1997.

Marcie G. Weinstein et al., American Institute of Physics, Applied Physics Letters, "*Hydrogen-Decorated Lattice Defects in Proton Implanted GaN*", vol. 72, No. 14, pp. 1703-1705, Apr. 6, 1998.

R. P. Vaudo et al., Phys. Stat. Sol. (a) "*GaN Boule Growth: A Pathway to GaN Wafers With Improved Material Quality*", vol. 194, No. 2, pp. 494-497, 2000.

A. Yasan et al., American Institute of Physics, Applied Physics Letters, "*Comparison of Ultraviolet Light-Emitting Diodes With Peak Emission at 340 nm Grown on GaN Substrate and Sapphire*", vol. 81, No. 12, pp. 2151-2153, Sep. 16, 2002.

Arthur Pelzmann et al., Elsevier Science Bl.V., Journal of Crystal Growth, "*Blue Light-Emitting Diodes on GaN Substrates, Growth and Characterization*", vol. 189/190, pp. 167-171, 1998.

I. Grzegory et al., Acta Physica Polonica A, High Pressure Research Center, Polish Academy of Sciences, UNIPRESS, Sokolowska 29/37, 01-142 Warsaw, Poland, "*Blue Laser on High N2 Pressure-Grown Bulk GaN*", vol. 100, pp. 229-232, 2001.

P. Prystawko et al., Phys. Stat. Sol. (a) "*Blue-Laser Structures Grown on Bulk GaN Crystals*", vol. 192, No. 2, pp. 320-324, 2002.

M. Kamp et al., "*GaN Homoepitaxy for Device Applications*", Cite this article as: MRS Internet J. Nitride Semicond. Res. 4S1, G10.2, High Pressure Research Center, Warsaw, Poland, 1999.

S. Porowski et al., Acta Physica Polonica A, High Pressure Research Center, Polish Academy of Sciences, Sokolowska 29/37, 01-142 Warsaw, Poland, "*High Resistivity GaN Single Crystalline Substrates*", vol. 92, No. 5, pp. 958-962, 1997.

J. I. Pankove et al., American Institute of Physics, Applied Physics Letters, "*Molecular Doping of Gallium Nitride*", vol. 74, No. 3, pp. 416-418, Jan. 18, 1999.

U.S. Appl. No. 09/683,659, filed Jan. 31, 2002.
U.S. Appl. No. 09/683,658, filed Jan. 31, 2002.
U.S. Appl. No. 10/693,126, filed Oct. 24, 2003.
U.S. Appl. No. 10/329,981, filed Dec. 27, 2002.
U.S. Appl. No. 10/686,136, filed Oct. 15, 2003.

* cited by examiner

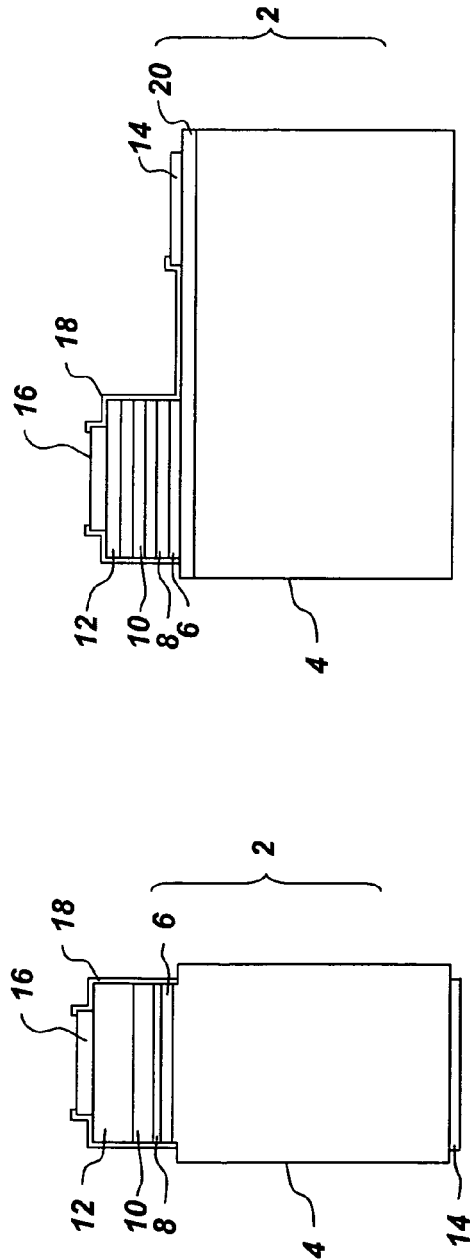
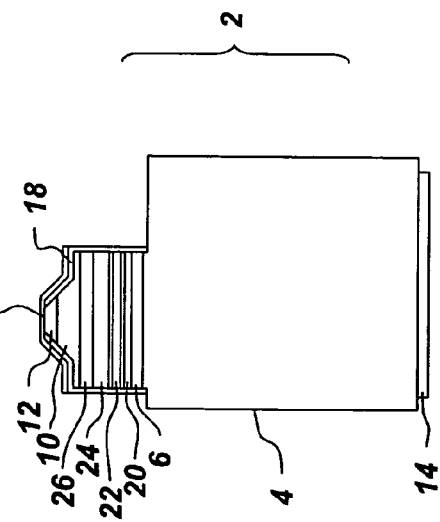
Fig. 1
Fig. 2
Fig. 3

HOMOEPITAXIAL GALLIUM-NITRIDE-BASED LIGHT EMITTING DEVICE AND METHOD FOR PRODUCING

CROSS REFERENCE TO RELATED APPLICATION

This application is a continuation-in-part of application Ser. No. 10/440,574, filed May 19, 2003, which is a Division of application Ser. No. 09/694,690, filed Oct. 23, 2000, and claims benefit therefrom.

BACKGROUND OF THE INVENTION

The present invention relates to lighting applications, more specifically to light emitting diode (LED) and laser diode (LD) applications. More specifically, the present invention relates to a homoepitaxial LED or LD structure and a method for making such a structure.

During the past decade there has been tremendous interest in gallium nitride (GaN) based optoelectronic devices, including light emitting diodes and laser diodes. Because high-quality GaN substrates have not been available, virtually all of the art has involved heteroepitaxial deposition of GaN and GaInAlN on sapphire or SiC substrates. A thin low-temperature buffer layer, typically AlN or GaN, is used in order to accommodate the lattice mismatch between GaN and the substrate and maintain an epitaxial relationship to the substrate.

The use of sapphire substrates with a low-temperature buffer layer has a number of important limitations for manufacture of LEDs. Sapphire is an electrical insulator, forcing electrical contacts to be made above and to the side of the device structure, rather than above and below (a so-called vertical device structure), wasting space on the wafer. In addition, sapphire has a rather poor thermal conductivity, limiting heat dissipation. Sapphire has a large (16%) lattice mismatch with respect to GaN, so that even with the use of buffer layers a very high level of threading dislocations ($10^7$–$10^{11}$ cm$^{-2}$) are generated within the device structure. These dislocations can act as non-radiative recombination centers and may limit performance in certain applications, such as, for example, reducing emission efficiency in near-ultraviolet and high power LEDs and LDs and reducing the lifetime in LDs. Deposition of the low-temperature buffer layer also adds cost and complexity to the process. Sapphire also has a large (45%) mismatch in the thermal expansion coefficient with respect to GaN, which generates stresses in device structures upon cooldown from the processing temperature and limits the maximum size of wafers and thickness of epitaxial layers that can be used without forming cracks. Facets must be prepared at the ends of laser diode structures in order to define the laser cavity, and the difficulty in cleaving c-axis-oriented sapphire makes facet preparation more expensive.

The use of SiC substrates alleviates some of these limitations but introduces other problems. The SiC lattice mismatch to GaN is smaller than that of sapphire, but very high defect concentrations are still generated, and the use of low-temperature buffer films is still needed. SiC is also much more expensive than sapphire. Lower cost SiC is typically opaque, decreasing the efficiency of the LED device because light emitted from the active region toward the substrate would be absorbed rather than transmitted. Since some applications of LEDs involve emission of ultraviolet light; this light could be absorbed by even a high-quality, transparent SiC substrate because the bandgap is less than that of sapphire or GaN.

A high-quality GaN substrate would reduce these problems. The substrate could be made electrically conductive as well as semi-insulating, so vertical LED or LD structures could be fabricated. The thermal conductivity of pure GaN is five times that of sapphire, improving heat dissipation, enabling higher power levels, and improving lifetime. Also, there would be no thermal expansion mismatch, resulting in ease of scalability to larger substrates, which would reduce cost. The concentration of threading dislocations would be reduced by 3–10 orders of magnitude, which would reduce leakage currents, improve device yields, and the consistency of I–V characteristics, increase device lifetimes, particularly at high power levels, and may also improve emission efficiency and resistance to static discharge. Furthermore, GaN is much easier to cleave than sapphire, and LD facets can be prepared by simple cleavage rather than by reactive ion etching, further reducing costs.

Some limited work has previously been carried out on forming homoepitaxial LED or LD devices on GaN substrates. Writing in the Journal of Crystal Growth, Pelzmann, et al. reported that homoepitaxial homojunction GaN LED devices demonstrated a doubling of the emission intensity relative to the analogous device on a sapphire substrate. However, homojunction GaN LEDs have much lower emission intensities than InGaN/GaN heterojunction LEDs, as is well known in the art. Therefore, the devices demonstrated by Pelzmann, et al. do not offer any performance advantages relative to conventional heteroepitaxial LEDs.

Kamp, et al. have developed a method for the formation of GaN crystals with homoepitaxial GaN growth thereon. This work focuses on the application of chemically assisted ion beam etching as a method for polishing the GaN crystal prior to LED formation. Grzegory et al. and Prystawko et al. have reported the fabrication of a pulsed-operation blue LD on a bulk GaN substrate. The homoepitaxial GaN-based LEDs described by Kamp et al. and the LD described by Grzegory et al. and by Prystawko et al. suffer from a number of important limitations that are overcome by the present invention. The single-crystal GaN substrates were grown in molten Ga with a $N_2$ overpressure of 10–20 kbar at a temperature below 1600° C. The undoped GaN crystals grown by this method have a high concentration (about $5 \times 10^{19}$ cm$^{-3}$) of n-type defects, which are believed to comprise oxygen impurities and nitrogen vacancies. As a consequence, the crystals are relatively opaque, with an absorption coefficient of about 200 cm$^{-1}$ at wavelengths between 700 nm (red) and 465 nm (blue) in the visible portion of the spectrum, and up to half the light emitted by the LED is absorbed by the substrate. This constitutes a large disadvantage compared to conventional heteroepitaxial LEDs fabricated on sapphire or transparent SiC substrates. In addition, the substrates employed by Kamp et al. have a dislocation density of approximately $10^3$ to $10^5$ cm$^{-2}$. This value is lower than the corresponding values in heteroepitaxial LEDs of approximately $10^7$ to $10^{10}$ cm$^{-2}$ but will still result in dislocations being present in large-area devices. Further, the high concentration of n-type defects in undoped crystals grown in molten Ga causes the lattice constant to increase by about 0.01–0.02%, which generates strain in undoped epitaxial GaN layers deposited thereupon. Additionally, the undoped GaN substrates employed by Kamp et al. have a rather limited carrier mobility, about 30–90 cm$^2$/V-s, which may be limiting in high-power devices.

Porowski, et. al., writing in Acta Physica Polonica A, disclosed a method for growing transparent GaN crystals involving the addition of 0.1–0.5% magnesium to a gallium growth medium at temperatures of 1400–1700° C. and nitrogen pressures of 10–20 kbar. This method is capable of producing GaN crystals with an optical absorption coefficient below 100 $cm^{-1}$. However, these crystals are semi-insulating, with an electrical resistivity of $10^4$–$10^6$ Ω-cm at room temperature, rendering them unsuitable as substrates for vertical light-emitting structures of one type described in the present invention. These substrates have several additional disadvantages, including: (i) a high concentration (approximately $10^{19}$ $cm^{-1}$) of Mg and O atoms, each [J. I. Pankove et al., Appl. Phys. Lett. 74, 416 (1999)], which could potentially diffuse into device structures during high temperature processing; and (ii) relatively poor thermal conductivity.

A final but very important limitation of the method of Porowski et al. is that it does not appear to be scalable; that is, the method is incapable of producing GaN boules and wafers having diameters greater than or equal to 50 mm. Instead, the process typically yields a number of platelet crystals, each having a diameter of about 10 mm and a thickness of 0.1–0.2 mm, with the largest crystal grown to date by this method being about 20 mm in diameter. Because the process of Porowski et al. yields platelets rather than thick boules, the economies of scale associated with conventional wafering technology (slicing, polishing) cannot be achieved.

The most mature technology for growth of pseudo-bulk or bulk GaN is hydride/halide vapor phase epitaxy, also known as HVPE. In the most-widely applied approach, HCl reacts with liquid Ga to form vapor-phase GaCl, which is transported to a substrate where it reacts with injected $NH_3$ to form GaN. Typically the deposition is performed on a non-GaN substrate such as sapphire, silicon, gallium arsenide, or $LiGaO_2$. The dislocation density in HVPE-grown films is initially quite high, on the order of $10^{10}$ $cm^{-2}$ as is typical for heteroepitaxy of GaN, but drops to a value of about $10^7$ $cm^{-2}$ after a thickness of 100–300 μm of GaN has been grown. For example, Vaudo et al. [U.S. Pat. No. 6,596,079] teach a method of fabricating GaN wafers or boules with a dislocation density below $10^7$ $cm^{-2}$. Yasan and co-workers, writing in Applied Physics Letters, disclosed a homoepitaxial light-emitting diode fabricated on a free-standing HVPE GaN substrate.

HVPE may be capable of reducing defect levels further in thicker films, but values below $10^4$ $cm^{-2}$ over an entire wafer appear to be unlikely. Edge dislocations, which normally comprise a significant fraction of the threading dislocations present in heteroepitaxially-grown GaN, are expected to persist indefinitely upon growth of an arbitrarily-thick GaN film. Even if GaN wafers are sliced from a thick HVPE-grown boule and used as a seed for additional growth, the edge dislocations are expected to persist indefinitely. Vaudo et al. [Phys. Stat. Solidi(a) 194, 494 (2002)] reported a dislocation density below $10^4$ $cm^{-2}$ within a grain of a thick HVPE film; however, the dislocation density between grains, most likely comprising predominantly edge dislocations, is expected to be much higher. In addition, strain is present in HVPE wafers due to the thermal expansion mismatch between substrate and film. This strain produces bowing upon cool down of the substrate and film after growth. The strain and bowing remains even after removal of the original substrate. Threading dislocations, strain, and bowing that are present in the substrate are expected to also be present in epitaxial layers deposited on such substrates to form light-emitting devices.

Moreover, neither absorption nor emission of light at room temperature occurs in thick HVPE GaN with a threshold at the band edge. In transmission spectroscopy, HVPE GaN absorbs with a cutoff near 370 nm, significantly shifted from the expected cutoff near 366 nm. Similarly, the photoluminescence peak at room temperature occurs at 3.35 eV, at significantly lower energy than expected. This behavior will compromise the performance of light emitting devices operating in the ultraviolet, as some of the light will be absorbed by the substrate rather than being emitted. The shifted photoluminescence peak indicates the presence of defect states that may compromise device performance.

Other widely-applied methods for growth of large area, low-dislocation-density GaN are variously referred to as epitaxial lateral overgrowth (ELO or ELOG), lateral epitaxial overgrowth (LEO), selective area growth (SAG), dislocation elimination by epitaxial growth with inverse pyramidal pits (DEEP), or the like. In some cases, such as U.S. Pat. No. 6,294,440 by Tsuda et al., a homoepitaxial light-emitting laser diode on such a substrate has been disclosed. In the case of all variations of the ELO method, heteroepitaxial GaN growth is initiated in a one- or two-dimensional array of locations on a substrate, where the locations are separated by a mask, trenches, or the like. The period or pitch of the growth locations is between 3 and 100 μm, typically between about 10 and 20 μm. The individual GaN crystallites grow and then coalesce. Epitaxial growth is then continued on top of the coalesced GaN material to produce a thick film or "ingot." Typically, the thick GaN layer formed on the coalesced GaN material is deposited by HVPE.

The ELO process is capable of large reductions in the concentration of dislocations, particularly in the regions above the mask, typically to levels of about $10^5$–$10^7$ $cm^{-2}$. However, light emitting devices fabricated on ELO substrates typically have a surface area of at least about $10^4$ $\mu m^2$ ($10^{-4}$ $cm^2$) and still contain a substantial number of threading dislocations. In addition, an ELO GaN substrate is not a true single crystal although a number of authors do refer to ELO structures as single crystals. Each individual GaN crystallite constitutes a grain, and there is typically a low-angle grain boundary or a tilt boundary at the points where the grains coalesce. The low-angle or tilt boundaries are manifested as an array of edge dislocations and generate rather high and nonuniform stresses within the GaN. The magnitude of the crystallographic tilting depends on the details of the masking and growth conditions, but there is generally at least a low level of tilting associated with grain coalescence. Much or most of the crystallographic tilting forms directly during growth, rather than simply being a consequence of thermal expansion mismatch. The separation between the tilt boundaries is equal to the period or pitch of the original mask, or typically about 10–20 μm. The tilt boundaries will persist indefinitely through epitaxial layers grown on such a substrate. The consequence is that devices formed on such substrates will also have tilt boundaries running through them if the devices have lateral dimensions larger than about 100 μm, and particularly if they have lateral dimensions larger than about 300 μm, and even more so if they have lateral dimensions larger than about 2000 μm. The tilt boundaries in substrates or devices can be detected by a range of analytical techniques, including transmission electronic microscopy, x-ray diffraction, and x-ray topography.

The tilt-grain-boundary structure and lateral strain persists throughout an entire ingot and therefore into each substrate sliced from this ingot. In other words, no substrate sliced from such an ingot will be a true single crystal, free of tilt boundaries and lateral strain, and no large-area device fabricated on such a substrate will be free of tilt boundaries. In addition, the GaN substrate is likely to suffer from the same deficiencies in UV absorption and photoluminescence at room temperature as "standard" HVPE GaN.

Residual stress or strain in homoepitaxial GaN-based devices resulting, for example, from the presence of tilt boundaries, may accelerate the degradation of LDs or high-power LEDs. Similarly, dislocations associated with tilt boundaries may reduce the lifetime of high-power light emitting diodes and laser diodes. An example of such behavior, showing the dependence of laser diode lifetime on dislocation density, is shown in FIG. 6. Degradation of device lifetimes by dislocations may result from facilitating impurity diffusion into the active layer or from facile generation of new dislocations. Dislocations may act as non-radiative recombination centers, degrading the light emission efficiency of light emitting diodes and laser diodes. Dislocations may also increase reverse-bias current leakage, further degrading device performance. Clearly, the presence of even a single dislocation within a GaN-based light-emitting device can degrade its performance and/or lifetime.

Gallium nitride grown by all known methods contains native defects that may degrade the properties of the crystal and of devices grown thereupon. One commonly occurring native defect is the Ga vacancy which, in n-type GaN, acts as a deep, triple acceptor that compensates donors. In principle, hydrogen can bind to gallium vacancies, capping the dangling bond on 1–4 surrounding N atoms to form N—H bonds, denoted $V_{Ga}H$, $V_{Ga}H_2$, $V_{Ga}H_3$, and $V_{Ga}H_4$. N—H bonds associated with Ga vacancies are predicted [C. Van de Walle, Phys. Rev. B 56, R10020 (1997)] to have vibration frequencies between 3100 and 3500 cm$^{-1}$ and to be quite stable. However, known GaN crystal growth methods do not provide a means for passivating Ga vacancies by hydrogenation. For example, infrared transmission spectroscopy on 300–400 μm thick GaN samples grown by HVPE revealed weak absorption features near 2850 and 2915 cm$^{-1}$ associated with another defect, but no absorption features between 3100 and 3500 cm$^{-1}$ that could be assigned to hydrogenated Ga vacancies were observed.

U.S. Pat. Nos. 5,770,887 and 5,810,925 to Tadatomo, et al., teach the growth of double-heterostructure LEDs on GaN pseudo-substrates. These pseudo-substrates comprise GaN/ZnO multilayers rather than GaN single crystals. The ZnO served as buffer layers throughout the crystal growth process, and the process therefore required extra steps for the formation and later removal of the ZnO layers. The reference does not disclose dislocation densities that are achievable by this method. U.S. Pat. No. 6,225,650, to Tadatomo et al., discloses a multi-step ELO process to form low-dislocation-density GaN base layers. As with other ELO methods, coalescence of laterally-grown GaN will cause formation of tilt boundaries in these base layers.

Doping of GaN by rare earth metals is known to produce luminescence. For example, Lozykowski et al. [U.S. Pat. No. 6,140,669] teach the incorporation rare earth ions into GaN layers by ion implantation, MOCVD, or MBE, and annealing at 1000° C. or greater. Birkhahn et al. [U.S. Pat. No. 6,255,669] teach the fabrication of light-emitting diodes using GaN layers doped with a rare earth ion or with chromium. However, these inventions focus on thin GaN epitaxial layers rather than bulk crystals. Growth of luminescent, bulk GaN or homoepitaxial GaN that is substantially free of tilt boundaries, with a dislocation density less than 10$^4$ or 100 cm$^{-2}$, is as yet unknown in the art.

Mueller-Mach et al. [WO 01/24285 A1] teach the fabrication of GaN-based light-emitting diodes on a single crystal phosphor substrate, preferably, rare-earth-doped yttrium aluminum garnet. DenBaars et al. [WO 01/37351 A1] teach the fabrication of GaN-based light-emitting diode structures on a substrate such as sapphire doped with chromium or other transition or rare earth ions. Neither set of inventors teaches the use of a transition- or rare-earth-metal-doped high quality gallium nitride substrate with fewer than 10$^4$ dislocations cm$^{-2}$.

It would therefore be desirable to develop a method for forming a high quality GaN substrate, free of tilt boundaries and with a dislocation density less than 10$^4$ cm$^{-2}$, on which to form homoepitaxial LED or LD devices, which would eliminate the above-mentioned problems.

SUMMARY OF THE INVENTION

In an exemplary embodiment of the present invention, a light emitting device comprised of a light emitting semiconductor active region disposed on a substrate comprised of GaN that is substantially free of tilt boundaries and having a dislocation density less than 10$^4$ per cm$^2$, more preferably below 103 per cm$^2$, and, even more preferably, below 100 per cm$^2$, is provided.

In a further exemplary embodiment of the present invention, a method for the preparation of a light emitting device comprising disposing a group III semiconductor active region on a substrate comprised of GaN that is substantially free of tilt boundaries in the absence of low-temperature buffer layers is described.

In yet another exemplary embodiment of the present invention, a homoepitaxial light emitting diode is provided. The homoepitaxial light emitting diode is comprised of: a n-electrode, a n-GaN substrate that is substantially free of tilt boundaries; optionally, at least one n-GaN or n-Al$_u$In$_v$Ga$_{1-u-v}$N cladding layer, an Al$_w$In$_x$Ga$_{1-w-x}$N active layer, at least one p-Al$_y$In$_z$Ga$_{1-y-z}$N cladding layer or p-GaN cladding layer; and a p-electrode, wherein 0≦u, v, w, x, y, z≦1, 0≦u+v, w+x, y+Z≦1, and wherein the band gap of the active layer is less than the band gap of the cladding layers.

In an additional exemplary embodiment of the present invention, a homoepitaxial laser diode is provided. The homoepitaxial laser diode comprises: a n-electrode; a n-GaN substrate that is substantially free of tilt boundaries; at least one n-GaN or n-Al$_a$In$_b$Ga$_{1-a-b}$N cladding layer; optionally, at least one n-Al$_c$In$_d$Ga$_{1-c-d}$N optical guiding layer; a Al$_e$In$_f$Ga$_{1-e-f}$N/Al$_g$In$_h$Ga$_{1-g-h}$N multiple quantum well; optionally, a p-Al$_i$In$_j$Ga$_{1-i-j}$N blocking layer; optionally, as least one p-Al$_k$In$_l$Ga$_{1-k-l}$N optical guiding layer; at least one p-Al$_m$In$_n$Ga$_{1-m-n}$N cladding layer; optionally, a p-Al$_o$In$_p$Ga$_{1-o-p}$N contact layer; and a p-electrode, wherein 0≦a, b, c, d, e, f g, h, i, j, k, l, m, n, o, p≦1, 0≦a+b, c+d, e+f, g+h, i+j, k+l, m+n, o+p≦1, wherein the band gap of the multiple quantum well active layer is less than that of the optical guiding layers, which are in turn less than that of the cladding layers, which are less than that of the p-type blocking layer. Sidewalls and parallel facets are then provided in directions perpendicular to the deposited layers.

BRIEF DESCRIPTION OF THE DRAWINGS

FIG. 1 is a detailed schematic illustration of the structure of a vertical homoepitaxial light emitting diode device representative of the present invention;

FIG. 2 is a detailed schematic illustration of the structure of a lateral homoepitaxial light emitting diode device representative of the present invention;

FIG. 3 is a detailed schematic illustration of the structure of a homoepitaxial laser diode device representative of the present invention;

DETAILED DESCRIPTION OF THE INVENTION

Figure 4:
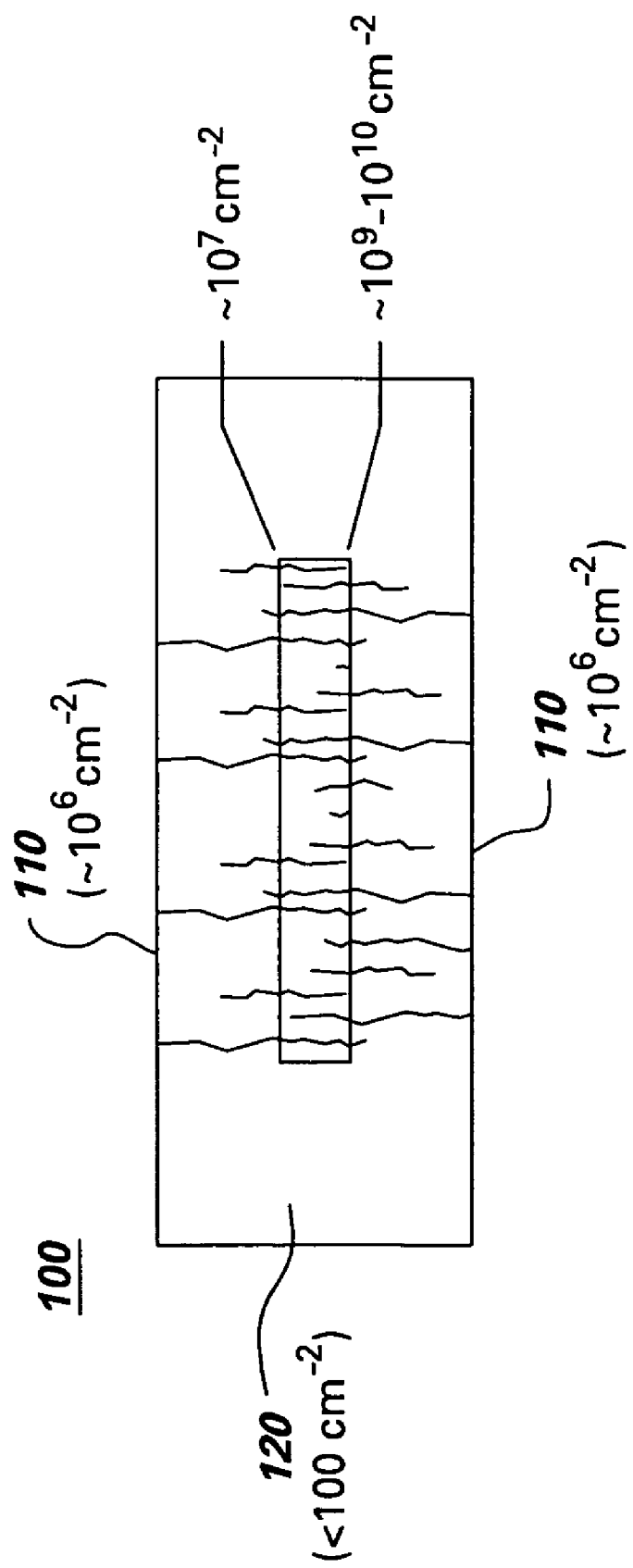
FIG. 4 is a schematic illustration of the evolution of dislocations in bulk GaN grown on a c-oriented seed crystal containing dislocations.

The present invention describes a homoepitaxial light emitting device and a method for forming that device. The present inventive device is a GaN based LED or LD grown on a GaN substrate that is substantially free of tilt boundaries. The LED or LD devices of the present invention are referred to as homoepitaxial even though the composition ($Al_u In_v Ga_{1-u-v} N$) and lattice constants of the active and cladding layers are not identical to those of the substrate (GaN), because the lattice constants of the active and cladding layers are typically close to those of GaN and the underlying chemistry is very similar, as all of the layers comprise at least one group III nitride. The GaN substrate for the device fabrication consists of a GaN wafer cut from a boule that was grown using a supercritical solvent at a temperature greater than about 550° C. and a pressure greater than about 5 kbar. In one embodiment, the substrate has a (0001) orientation. In other embodiments, the orientation may be (000$\bar{1}$), (11$\bar{2}$0), (1$\bar{1}$00), or orientations vicinal to these. The (11$\bar{2}$0) and (1$\bar{1}$00) orientations have the advantage of being non-polar, so that piezoelectric fields will not cause band offsets in heterostructure interfaces. The substrate is substantially free of tilt boundaries, has a dislocation density less than about $10^4$ cm$^{-2}$, and is preferably n-type and substantially transparent, with an optical absorption coefficient less than 5 cm$^{-1}$ for wavelengths between 700 nm (red) and 465 nm (blue). In one embodiment, the crystal contains hydrogen in a form that results in an infrared absorption peak near 3175 cm$^{-1}$, with an absorbance per unit thickness greater than about 0.01 cm$^{-1}$. In another embodiment, the substrate contains greater than about 0.04 ppm fluorine, and typically between about 0.04 and about 1 ppm fluorine.

More specifically, one suitable process for forming the GaN substrate comprises providing a source gallium nitride, solvent, mineralizer, and, preferably, at least one GaN seed crystal. The source gallium nitride may comprise at least one of poorly-crystallized gallium nitride, well-crystallized gallium nitride, amorphous gallium nitride, polycrystalline gallium nitride, and combinations thereof. The source gallium nitride may be provided "as-is" in its 'raw' form, such as, for example, a loose powder. Alternatively, the source gallium nitride can be compacted into a "pill" and/or sintered into a polycrystalline compact. Alternatively, the source gallium nitride can be formed in situ. Gallium metal may be provided, which then reacts with the ammonia solvent after sealing of the capsule and treatment at high pressure and high temperature to form source gallium nitride.

The source gallium nitride may then be combined with at least one of the mineralizer and solvent to form a mixture. The gallium nitride, solvent, and mineralizer may optionally be provided individually to the capsule as separate and distinct un-combined materials. The mixture, which can comprise gallium nitride and at least one of the solvent and mineralizer, can be optionally compacted into a pill, however the compacting of the mixture need not be conducted in the gallium nitride growth process.

The source gallium nitride, solvent, and mineralizer, whether as a mixture that is compacted or not compacted, and, in one embodiment, at least one GaN seed crystal, are then placed inside a capsule. Optionally, additional mineralizer can also be added to the capsule. The capsule, which will be described hereinafter, can then be filled with a nitrogen-containing solvent, for example, at least one of ammonia or hydrazine, or an organic solvent, such as, but not limited to, methylamine, melamine, or ethylene diamine, and mixtures thereof. The capsule is then sealed, disposed in a pressure cell, and subjected to high pressure and high temperature conditions, wherein the pressure within the pressure cell is in a range from greater than about 5 kbar to about 80 kbar, and the temperature for the gallium nitride crystal growth process is in a range between about 550° C. and about 3000° C., in an appropriate high pressure high temperature (HPHT) system. The HPHT conditions are maintained for a length of time sufficient to dissolve a substantial portion of the source gallium nitride and precipitate it onto at least one gallium nitride crystal, gallium nitride boule, or gallium nitride crystal seed.

Maintaining HPHT conditions for a sufficient period of time yields large single gallium nitride crystals, such as, for example, single gallium nitride crystals having a diameter and thickness in a range from about 0.02 inch (about 0.05 cm) to about 12 inches (about 30 cm). For example, a single crystal of gallium nitride having a size in a range from about 2 inches to about 6 inches may be obtained. The actual time period over which HPHT conditions are maintained depends upon the size of gallium nitride crystal that is desired, and range from about six hours up to 60 days. The pressure, as embodied by the invention, is in a range from greater than about 5 kbar to about 80 kbar, and the temperature for the gallium nitride crystal growth process is in a range between about 550° C. and about 3000° C. The GaN single crystals thus formed are substantially transparent, with an absorption coefficient below 100 cm$^{-1}$. Furthermore, n-type substrates of the present invention have carrier mobilities above about 100 cm$^2$/V-s and strain, with respect to undoped GaN homoepitaxial layers, below about 0.005%.

After being maintained under HPHT conditions for a predetermined time, the HPHT system is then allowed to cool and the high pressure is relieved. The gallium nitride crystals are removed from the HPHT system and pressure cell and washed in water and mineral acids. The mineral acids for washing the gallium nitride crystals include, but are not limited to, hydrochloric acid (HCl) and nitric acid (HNO$_3$).

The mineralizers, as embodied by the invention, comprise at least one of alkali and alkaline-earth nitrides, such as Li$_3$N, Mg$_3$N$_2$, and Ca$_3$Na$_2$; amides, such as LiNH$_2$, NaNH$_2$, and KNH$_2$; urea and related compounds, ammonium salts, such as NH$_4$F and NH$_4$Cl; halide, sulfide, and nitrate salts of transition metals, alkali metals, alkaline earth metals, and rare-earth metals, such as NaCl, CeCl$_3$, Li$_2$S, and KNO$_3$; and combinations thereof. The mineralizers may be provided as solids or as additives dissolved in fluids, such as solvents. Examples of solvents include, but are not limited to ammonia, hydrazine, and methylamine. The use of alkaline-earth or rare-earth mineralizers have the additional advantage of acting as a getter for adventitious oxygen in the growth medium, allowing for the growth of undoped GaN crystals with low n-type carrier density. Alternatively, the mineralizer can be formed in situ. At least one of lithium, sodium, potassium, rubidium, cesium, magnesium, calcium, strontium, barium, and a rare-earth metal may be provided, which then react with the ammonia solvent to form the mineralizer. In a preferred embodiment, the mineralizer is ammonium fluoride ($NH_4F$).

In yet another embodiment, a dopant source is added to the process, in order to provide n-type, semi-insulating, p-type, magnetic, luminescent, or optically absorbing GaN crystals. Adventitious impurities such as oxygen or carbon will otherwise normally render the crystals n-type. Dopants such as Si (n-type) and Be, Mg or Zn (p-type) may be added as impurities in the source GaN. Alternatively, the dopants may be added as metals, salts, or inorganic compounds, such as Si, $Si_3N_4$, $SiCl_4$, $BeF_2$, $Mg_3N_2$, $MgF_2$, Zn, $ZnF_2$, $Zn_3N_2$, and the like. GaN crystals with total impurity concentrations below about $1016$ $cm^{-3}$ are expected to be semi-insulating. Typically, however, the concentration of unintentional impurities is higher than $1016$ $cm^{-3}$ and the crystals are n-type. Semi-insulating GaN crystals may be obtained by doping with at least one of Sc, Ti, V, Cr, Mn, Fe, Co, Ni, and Cu. In one embodiment, semi-insulating GaN crystals are produced by doping with Fe or Co. Magnetic GaN crystals may be obtained by doping with certain transition metals, such as Mn or the like. Luminescent GaN crystals may be obtained by doping with certain transition or rare-earth metals such as, but not limited to, Ti, V, Cr, Mn, Fe, Co, Ni, Zr, Hf, Pr, Eu, Er, or Tm. The transition-metal or rare-earth dopants may be added as impurities in the source GaN or separately as metals, salts, or inorganic compounds, such as Fe, Co, $CoF_2$, CrN, or $EuF_3$, either alone or in combination with one or more additional dopants such as O, Si, Mg, Zn, C, or H. Such dopants may be present in concentrations raging from about $1015$ $cm^{-3}$ to about $1021$ $cm^{-3}$ in the source GaN. Depending on the identity and concentration of the dopant, the GaN crystal may be optically absorbing in at least the visible spectrum, and probably in the ultraviolet region as well—i.e., the crystal is black in color. We have found that heavily Co-doped GaN crystals are black in color and that no photoluminescence was observable upon irradiation with a 266-nm nitrogen laser. The ratio of the intensity of near-band-edge photoluminescence from the black GaN crystal to that of a near-transparent, nominally undoped GaN crystal was less than 0.1%.

The filling and sealing steps will now be described. The capsule is filled with a nitrogen-containing solvent, for example at least one of ammonia, hydrazine and an organic solvent, such as, but not limited to methylamine, melamine, or ethylenediamine. The capsule is filled without admitting air or water, which are undesirable in the gallium nitride formation process. To fill the capsule without admitting air or water, the capsule is filled and connected to a negative pressure source, such as a vacuum manifold, and evacuated. The capsule is then chilled to a temperature below room temperature (preferably to about −72° C. or below) and vapor-phase solvent can be admitted to the manifold. The vapor-phase solvent then condenses in the capsule. For example, if the nitrogen-containing solvent comprises ammonia, the condensation can be performed at dry ice or liquid-nitrogen temperatures.

The capsule can then be isolated so as to seal the capsule by closing a valve to the negative pressure source. The capsule can then be separated from at least one of the manifold or the valve by a pinching-off step using a cold welding apparatus, which is well known in the art. The pinching-off step is particularly effective if the capsule is copper. The integrity of the seal may be enhanced by optional arc-welding.

The capsule and pressure cell comprise any appropriate form that permits the gallium nitride growth process to withstand the high pressure and high temperature as embodied by the invention. The HPHT system that applies the high pressures and high temperatures can comprise a press device, which may include at least one of a die and punch. For example, the press device comprises one of a piston-cylinder press; a belt press; a tetrahedral-, cubic-, or octahedral-anvil press; a recessed-anvil press; and a toriod-type press, each of which are known to those of skill in the art. Preferred capsules and pressure cells are described in U.S. patent application Ser. No. 09/683,659, entitled "High Temperature High Pressure Capsule for Processing Materials in Supercritical Fluids," by Mark Philip D'Evelyn et al., and U.S. patent application Ser. No. 09/683,658, entitled "Improved Pressure Vessel," by Mark Philip D'Evelyn et al., both filed on Jan. 31, 2002, and incorporated herein by reference in their entirety.

The foregoing description of the process for forming the GaN crystal substrate is intended to be illustrative only, and should not be construed in any limiting sense. Other methods for forming the crystal will be obvious to those skilled in the art, but are intended to fall within the scope of the present disclosure.

The GaN crystal formed is of high quality as determined by a measurement of dislocation density and substantially free of crystallographic tilt boundaries. The dislocation density is determined by performing transmission electron microscopy (TEM) on a thin section, by etch-pit density measurements, or by cathodoluminescence imaging, as is well known in the art. A GaN crystal of the immediate invention contains less than $10^4$ threading dislocations per $cm^2$, preferably less than $10^3$ dislocations per $cm^2$, and even more preferably less than 100 dislocations per $cm^2$.

The GaN single crystal may also be formed by other methods, such as the methods described in U.S. patent application Ser. No. 10/329,981, entitled "Gallium Nitride Crystal and Method for Making Same," by Mark Philip D'Evelyn et al., filed on Dec. 27, 2002, which is hereby incorporated herein by reference in its entirety. In order to keep the concentration of undesired dopants, such as oxygen, to an acceptable level, the impurity levels in the raw materials (source gallium nitride, mineralizer, and solvent) and capsules must be limited to appropriately low levels. For example, an oxygen concentration in the grown crystals below $3\times10^{18}$ $cm^{-3}$ may be achieved by holding the total oxygen content in the raw materials and capsule below 15 parts per million, expressed with respect to the weight of the final crystal, and an impurity level below $3\times10^{17}$ $cm^{-3}$ may be achieved by holding the total oxygen content in the raw materials and capsule below 1.5 parts per million.

In a preferred embodiment, the GaN seed crystals have a dislocation density below $10^4$ $cm^{-2}$ and are substantially free of tilt boundaries (also known as low-angle grain boundaries), resulting in GaN crystals that similarly have a dislocation density below about $10^4$ $cm^{-2}$ and are substantially free of tilt boundaries. In another embodiment, the GaN seed crystals contain one or more tilt boundaries. For example, GaN crystals grown by HVPE may be employed as seed crystals. Such an approach offers a convenient path to large-area seed crystals. However, GaN crystals grown by HVPE typically have a dislocation density in the range of $10^5$–$10^8$ cm$^{-2}$. In addition, heteroepitaxy produces mosaic structures, and as the thickness of the heteroepitaxial film increases, for example, above 1 mm, the presence of tilt boundaries in the thick film becomes increasingly apparent. A bulk GaN crystal grown according to the present invention on a seed with tilt boundaries will also contain tilt boundaries.

Figure 5:
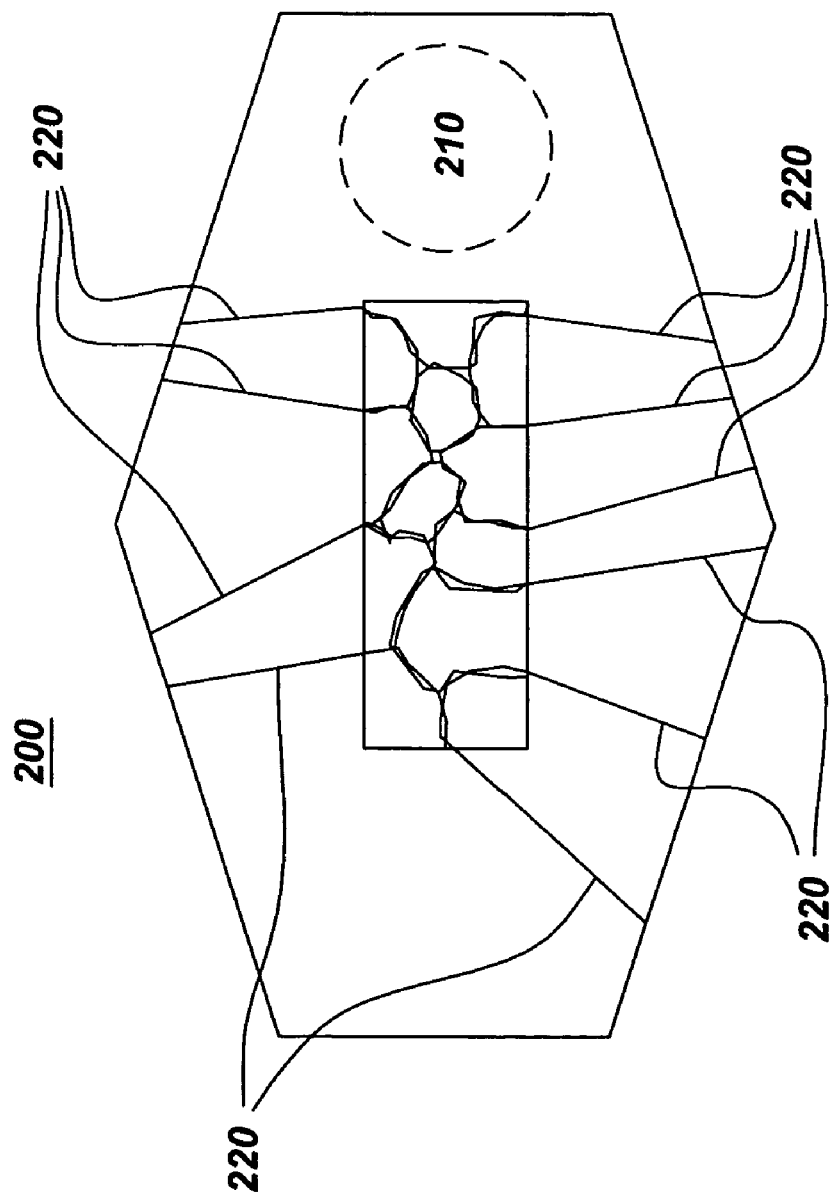
FIG. 5 is a schematic illustration of the evolution of tilt boundaries in bulk GaN grown on a c-oriented seed crystal containing tilt boundaries.
Figure 6:
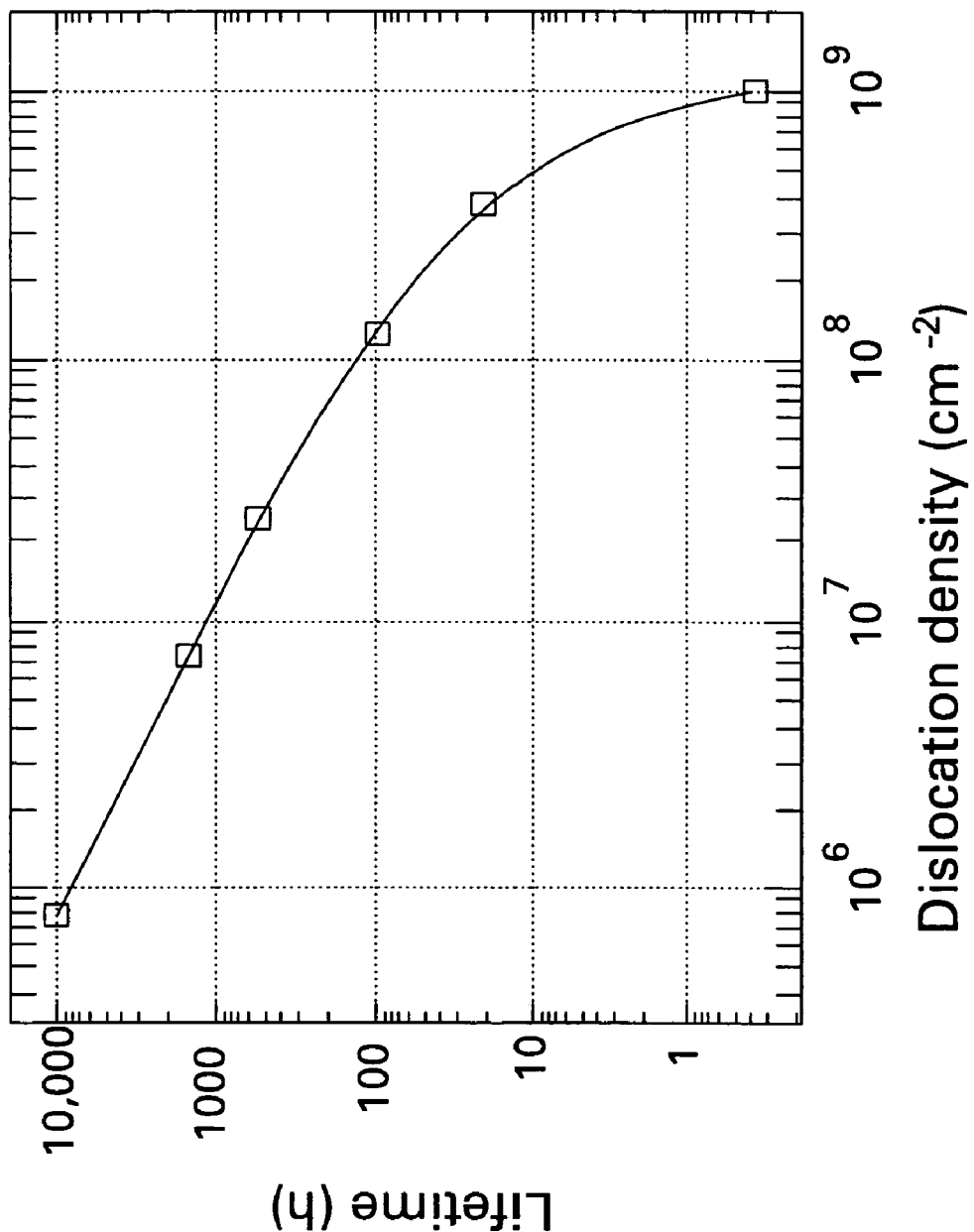
FIG. 6 shows the dependence of laser diode lifetime on dislocation density.

GaN crystals with a dislocation density below about $10^4$ cm$^{-2}$ that are substantially free from tilt boundaries may be grown from seed crystals with a dislocation density of about $10^5$–$10^8$ cm$^{-2}$ and tilt boundaries by the following procedure. By controlling solvent fill, mineralizer concentration, temperature, and temperature gradient, growth on the seed will occur in both the c direction (that is, along the c-axis of the GaN crystal lattice, in the (0001) and (000$\bar{1}$) directions) and perpendicular to the c direction. The evolution of dislocations in bulk GaN grown on a c-oriented seed crystal is schematically shown in FIG. 4. The dislocation density in bulk GaN grown in the c-direction is reduced significantly. For example, growth of a 300–800 μm thick layer above a c-oriented seed crystal 100 containing approximately $10^7$ dislocations cm$^{-2}$ results in a GaN crystal with approximately 1–3×$10^6$ dislocations cm$^{-2}$ in the region 110 above the seed, as shown in FIG. 4. However, the bulk GaN grown laterally (region 120) with respect to a c-oriented seed crystal has fewer than $10^4$ dislocations cm$^{-2}$, preferably fewer than $10^3$ dislocations cm$^{-2}$, and even more preferably fewer than 100 dislocations cm$^{-2}$, as illustrated in FIG. 4. The evolution of tilt boundaries in bulk GaN grown on a c-oriented seed crystal having tilt boundaries is schematically shown in FIG. 5. Tilt boundaries 220 that are present in a c-oriented seed crystal will propagate during growth in the c direction, resulting in a grain structure in bulk GaN grown above the seed that is similar to that in the seed, as illustrated schematically in FIG. 5. However, tilt boundaries 220 will radiate outward in bulk GaN that is grown laterally, resulting in progressively larger domains 210 that are free of tilt boundaries as the crystal becomes larger, as illustrated in FIG. 5. The position of the tilt boundaries 220 may be determined by a method that is well known in the art, such as x-ray diffraction, x-ray topography, or simple optical reflection, and a new seed crystal may be cut from regions or domains 210 in the laterally-grown GaN that are entirely free of tilt boundaries. Bulk GaN grown from this new seed crystal will be substantially free of tilt boundaries and will have a dislocation density below $10^4$ cm$^{-2}$, preferably below $10^3$ cm$^{-2}$, and even more preferably below 100 cm$^{-2}$. Epitaxial GaN or Al$_u$In$_v$Ga$_{1-u-v}$N layers, where 0≦u, v, u+v≦1, deposited on GaN wafers fabricated from the inventive bulk GaN crystals will similarly be substantially free of tilt boundaries and will have a dislocation density below $10^4$ cm$^{-2}$, preferably below $10^3$ cm$^{-1}$, and even more preferably below 100 cm$^{-2}$.

Figure 7:
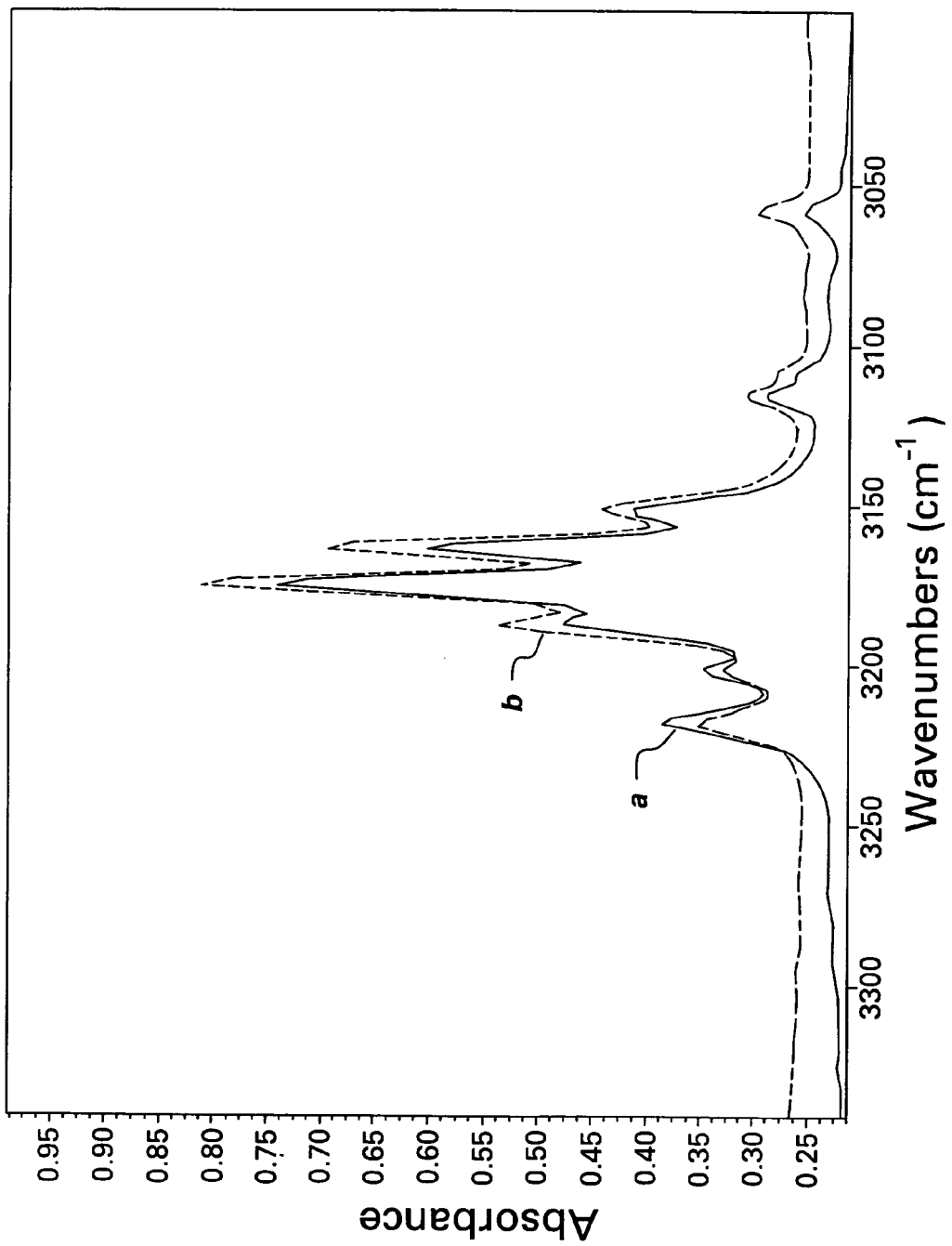
FIG. 7 shows the infrared spectrum of an exemplary bulk GaN substrate or homoepitaxial light-emitting device.

A GaN single crystal formed by the method described above was characterized by infrared transmission spectroscopy and Raman spectroscopy. In contrast to GaN grown by other methods, the infrared spectrum of the GaN crystal grown by the method of the present invention had at least one sharp absorption peak in the range of 3050 to 3300 cm$^{-1}$, with a maximum absorption near 3175 cm$^{-1}$, as shown in FIG. 7. The crystal was annealed at about 750° C. in high purity nitrogen for 30 min and the infrared spectrum was re-measured. The absorption peaks in the range from about 3050 cm$^{-1}$ to about 3300 cm$^{-1}$ were essentially unchanged, as shown in FIG. 7, indicating a high stability of those species responsible for the absorption. Based on predictions of vibrational frequencies of 3100–3470 cm$^{-1}$ for V$_{Ga}$H$_1$–V$_{Ga}$H$_4$ (which may overestimate the actual frequencies by about 200 cm$^{-1}$) and the observation of infrared absorption features at 3020–3050 cm$^{-1}$ and at 3140 cm$^{-1}$ in hydrogen-implanted GaN [M. G. Weinstein et al., Appl. Phys. Lett. 72, 1703 (1998)], the absorption peaks between 3150 and 3200 cm$^{-1}$ in observed for the GaN crystal of the present invention correspond to V$_{Ga}$H$_3$ and V$_{Ga}$H$_4$. In addition, the absorption peaks observed between 3000 and 3150 cm$^{-1}$ in both the GaN crystal of the present invention and hydrogen-implanted GaN correspond to V$_{Ga}$H$_1$ and V$_{Ga}$H$_2$, and that other minor peaks may be associated with the presence of other impurities or defects. Thus, the presence of an infrared absorption feature near 3175 cm$^{-1}$ in GaN crystals grown by the method of the present invention indicates passivation of gallium vacancies by hydrogenation, and the persistence of the infrared feature upon high temperature annealing indicates that this passivation is quite stable. Depending on the concentration of hydrogenated gallium vacancies in the GaN crystal, the absorbance per unit thickness of the 3175 cm$^{-1}$ peak will lie between about 0.01 and 200 cm$^{-1}$.

Additional evidence for the passivation of point defects in a GaN crystal grown by the method of the present invention was obtained by Raman spectroscopy. A total of five peaks were observed in two configurations between 400 and 800 cm$^{-1}$. The peaks, with the assignments in brackets, were observed at 530 cm$^{-1}$ [A$_1$(TO)], 558 cm$^{-1}$ [E$_1$ (TO)], 569 cm$^{-1}$ [E$_2$ (high)], 734 cm$^{-1}$ [A$_1$(LO)], and 742 cm$^{-1}$ [E$_1$ (LO)]. These values are all within a few cm$^{-1}$ of accepted values for pure GaN reported in the literature. A broad peak associated with phonon-plasmon coupling was not observed. The observation of unshifted LO modes and the absence of a phonon-plasmon mode indicates a carrier concentration below $10^{17}$ cm$^{-3}$, based on Raman measurements reported in the literature on GaN with carrier concentrations between $10^{16}$ cm$^{-3}$ and $10^{20}$ cm$^{-3}$. The total impurity concentration in this crystal was above $10^{19}$ cm$^{-3}$. The drastic reduction in carrier concentration relative to the impurity concentration indicates a high degree of compensation, most likely due to hydrogen.

The incorporated hydrogen is believed to have a beneficial effect. Typical gallium nitride crystal growth methods do not provide passivation of gallium vacancies by hydrogenation, even if hydrogen is in the growth system. For example, infrared transmission spectroscopy on 300–400 mm thick GaN samples grown by hydride vapor phase epitaxy (HVPE) revealed weak absorption features near 2850 and 2915 cm$^{-1}$ associated with another defect, but no absorption features between 3100 and 3500 cm$^{-1}$ that could be assigned to hydrogenated Ga vacancies were observed in the HVPE gallium nitride material.

Within the visible spectrum, the gallium nitride boule typically exhibits substantial transparency. The optical absorption coefficient for nominally undoped crystals is generally less than 5 cm$^{-1}$ between 465 nm and 700 nm. Doped crystals exhibit similarly low absorption, although some free carrier absorption may be introduced at high carrier concentrations. Moreover, dopants, substitutional or interstitial impurities, vacancy complexes, or other point defects may introduce narrow peaks of higher absorption within the visible range. Such point defect-related narrow absorption peaks typically do not, however, significantly reduce the substantial transparency of the crystal in the visible for purposes such as backside extraction of illumination or other useful light output generated by the light emitting device.

In the case where a gallium nitride boule is grown using a mineralizer comprising at least one of $NH_4F$, $GaF_3$, or other compounds obtainable by reaction of Ga, GaN, $NH_3$, and HF, the gallium nitride boule contains greater than about 0.04 ppm fluorine, and typically between about 0.04 and about 1 ppm fluorine. By contrast, GaN crystals grown with fluorine-free mineralizers typically contain less than 0.02 ppm fluorine. The incorporated fluorine is suitably quantified by glow discharge mass spectrometry, secondary ion mass spectrometry, fusion-dissolution followed by inductively-coupled plasma or fluorine-selective-electrode analysis, or the like. As with the case of incorporated hydrogen, the incorporated fluorine is believed to have a beneficial effect. Bond lengths to fluorine in molecules or solids are typically only slightly larger than the corresponding bonds to hydrogen, so that fluorine may play a similar role passivating defects.

After the GaN crystal has been formed, the crystal or boule is further processed and sliced into one or more wafers, lapped, polished, and chemically polished. The wafer or substrate preferably has a thickness between about 0.01 and 10 mm, most preferably between about 0.05 and 5 mm, and is useful as a substrate for the device fabrication. In one embodiment, the wafer comprises n-type GaN, with an electrical resistivity less than about 100 Ω-cm, more preferably less than about 10 Ω-cm, or even more preferably less than about 1 Ω-cm. In another embodiment the wafer comprises p-type GaN, and in still another embodiment the wafer comprises semi-insulating GaN. The substrate is then polished to a mirror finish using mechanical-polishing techniques that are known in the art. Subsurface damage may remain after the polishing process. This damage may be removed by several methods that are known in the art, including chemically assisted ion beam etching, reactive ion etching, or chemo-mechanical polishing. The residual damage may also be removed by heating the wafer to a temperature between about 700° C. and 1500° C. in a nitrogen-containing atmosphere, such as, for example, $N_2$ or ammonia, at a partial pressure between about $10^{-8}$ mbar and 20,000 bar. The substrate preferably has a thickness between about 0.01 mm and 10 mm, most preferably between about 0.05 mm and 5 mm.

The wafer used in the present invention is preferably a wurtzite-structure material. In one embodiment, the (0001)-oriented GaN wafers has a Ga-terminated (0001) face (c plane) and an N-terminated (000$\bar{1}$) face. The wafer may also be prepared in other orientations, such as, but not limited to, the non-polar (10$\bar{1}$0) (m plane) and (11$\bar{2}$0) (a plane) orientations and surfaces vicinal (off-axis) with respect to the (0001) or (000$\bar{1}$) faces. The (0001) Ga face may be superior for deposition of LED and LD device structures, but other orientations are also advantageous. For example, the use of nonpolar (10$\bar{1}$0) or (11$\bar{2}$0) orientations avoids the presence of piezoelectric fields within the light-emitting device structure and may enable improved overlap between electron and hole wavefunctions and increased emission efficiencies.

The present invention will be described below in detail with reference to the accompanying drawings. The same reference numerals denote the same parts throughout the drawings.

To begin the device fabrication, the GaN wafer is placed in a growth reactor which is then evacuated. Residual surface defects are annealed, and/or adventitious contaminants removed, by heating the wafer to a temperature between about 700° C. and 1200° C. in a nitrogen-containing atmosphere, such as, for example, $N_2$ or ammonia, at a partial pressure between about $10^{-6}$ mbar and about 1 bar.

The active device structure is fabricated by metalorganic vapor-phase epitaxy (MOVPE) or by molecular beam epitaxy (MBE). These techniques are well known in the art.

With reference to FIG. 1, a detailed schematic illustration of the structure of one embodiment of a homoepitaxial light-emitting diode device 2 representative of the present invention is shown. The GaN wafer 4 is shown as the substrate upon which the device is formed. The device structure 2 is formed by decomposition of organometallic precursors in an ammonia-containing atmosphere on the surface of substrate 4. A carrier gas, such as hydrogen or helium, may be used. Suitable organometallic precursors include trimethylgallium, trimethylaluminum, trimethylindium, and mixtures thereof. Suitable dopant precursors include silane for n-type material, and bis-(cyclopentadienyl) magnesium or dimethyl zinc, for p-type material.

After the substrate 4 has been annealed, as described above, a cladding layer of n-type GaN or $Al_uIn_vGa_{1-u-v}N$, where $0 \leq u, v, u+v \leq 1$, 6 is optionally formed on the surface of the substrate 4. The n-type GaN or $Al_uIn_vGa_{1-u-v}N$ cladding layer 6 has a thickness between about 1 nm and 10 μm, preferably between about 0.1 and 4 μm. The deposition of the n-type GaN or $Al_uIn_vGa_{1-u-v}N$ cladding layer 6 may lead to improved electrical properties relative to the substrate itself, a different doping level and electrical conductivity, a higher bandgap, or combinations thereof.

The active layer 8 is then deposited on the optional n-type GaN or $Al_uIn_vGa_{1-u-v}N$ 6 or the substrate 4, in the absence of the n-type GaN or $Al_uIn_vGa_{1-u-v}N$ 6 layer. The active layer 8 comprises $Al_wIn_xGa_{1-w-x}N$, where $0 \leq w, x, w+x \leq 1$ and, preferably, at least one of w and x are nonzero. For w=0, as x varies from 0 to 1, the bandgap varies between 3.4 eV and 0.8 eV, allowing for light emission between the ultraviolet and red regions of the electromagnetic spectrum. The composition of the cladding layer is chosen so that its band gap is larger than that of the active layer. Typically, x will lie between about 0.025 and 0.6. More preferably, x is between about 0.05 and 0.5. Typically w<0.05. The active layer may be undoped, n-type doped with impurities such as Si or Ge, or p-type doped, with impurities such as Zn or Mg. It may comprise a single layer, as in so-called double heterostructure or single quantum-well structures, or it may comprise a superlattice of $Al_cIn_dGa_{1-c-d}N/Al_eIn_fGa_{1-e-f}N$, where $0 \leq c, d, e, f, c+d, e+f \leq 1$, or of $In_dGa_{1-d}N/In_fGa_{1-f}N$, where $0 \leq d \leq f$ in so-called multiple-quantum well structures. The superlattice will preferably comprise about 1–50 alternating layers of the two different compositions of AlInGaN, with the more In-rich/Al-poor layers (lower bandgap) comprising the well and the less In-rich/Al poor layers (higher bandgap) comprising the barrier. Each individual layer may have a thickness between about 0.5 nm and 50 nm. The well and barrier layers may be undoped, n-type, or p-type doped. The preferred structure comprises undoped well layers, and n-type doped or undoped barrier layers. InN and $Al_cIn_dGa_{1-c-d}N$ decompose at a temperature lower than does GaN. Therefore, these layers should be deposited at temperatures between about 500° C. and 1200° C., and, more preferably, between about 650° C. and 1050° C.

If the active layer is n-type doped, and relatively thick, between about 50 nm and 500 nm, the LED would be a double-heterostructure device, particularly if the n-type cladding layer 6 comprised $Al_uIn_vGa_{1-u-v}N$ rather than GaN. If the active layer is undoped and relatively thin, about 1 to 10 nm, the LED device would be a single quantum well, particularly if at least one additional n-$Al_uIn_vGa_{1-u-v}N$ cladding layer is positioned between the n-GaN layer 6 and the active layer 8.

One or more cladding layers are optionally disposed around the active layer 8. As seen in FIG. 1, cladding layer 10 comprises a p-type cladding layer. In FIG. 1, cladding layer 10 comprises p-$Al_yIn_zGa_{1-y-z}N$, wherein $0 \leq y$, z, $y+z \leq 1$. The cladding layers 10 have the property of a larger bandgap than that of the active layer 8, and are useful for confining the electrical carriers and, in the case of laser diodes, of favorably directing light emission in the desired directions via optical confinement. The cladding layers 6 and 10 are preferably deposited at temperatures between about 600° C. and 1500° C., and, more preferably, between about 850° C. and 1200° C. In one embodiment, at least one cladding layer is comprised of a $Al_yIn_zGa_{1-y-z}N$ superlattice. The use of a superlattice helps manage lattice strain and, particularly in the case of the p-cladding layer, increases the electrical conductivity.

Above the p-doped cladding layer, one or more p-contact layers 12 may be optionally deposited. In one embodiment, the p-contact layer 12 comprises p-GaN. In another embodiment, advantageous for current-spreading, the p-contact layer comprises a p$^+$-$Al_yIn_zGa_{1-y-z}N$ superlattice. In another embodiment, the p-contact layer comprises a p$^+$-$Al_yIn_zGa_{1-y-z}N$-to-n$^+$-$Al_yIn_zGa_{1-y-z}N$ tunnel junction. In yet another embodiment, a tunnel junction is combined with at least one of a p$^+$-$Al_yIn_zGa_{1-y-z}N$ superlattice and a n$^+$-$Al_yIn_zGa_{1-y-z}N$ superlattice. In still another embodiment, the p-contact layer comprises at least one metal oxide $MO_x$, where $0 < x \leq 2$ and the metal M comprises at least one of indium, tin, zinc, gold, silver, copper, and nickel.

One common impurity in GaAlInN devices is hydrogen. In the case of p-type material, the hydrogen may complex with acceptor centers and cause the resistivity to be high, degrading device performance. The hydrogen-acceptor complexes may be dissociated in the present invention by annealing at a temperature above about 400° C., or their formation may be avoided in the first place by use of a hydrogen-free growth environment, such as argon, nitrogen, or vacuum. In the absence of hydrogen, the resistivity of the p-type layers should be below about $10^5$ Ω-cm, or more typically about 10 Ω-cm.

In the next step in the formation of the light emitting diode devices of the present invention, metallic and/or conductive-oxide contacts 14,16 are formed on the top (p-type) and bottom (n-type) surfaces. Most of the area of the p-type contact 16 is very thin, about 0.001 to about 1 μm thick, so as to be substantially optically transparent. Suitable compositions for the p-type contact 16 include nickel-gold, or at least one metal chosen from Pd, Pt, Ag, Au, Al, Sn, In, Cr, Ti, and mixtures thereof. A conductive-oxide contact comprises at least one of indium oxide, tin oxide, and zinc oxide, or combinations thereof. The nickel-gold p-type contact 16 may be alloyed and oxidized or may contain a nickel-rich composition in contact with the p-GaN layer 12, and a gold-rich composition in contact with the nickel-rich layer. In one embodiment, the p-type contact is highly reflective, for example, comprising at least one of Ag, Al, or Rh, so as to permit improved light extraction through the substrate. Additional embodiments for reflective p-type contacts are described in U.S. patent application Ser. No. 10/693,126, entitled "Flip Chip Light Emitting Diode" by Edward B. Stokes et al., filed Oct. 24, 2003, which is hereby incorporated in its entirety by reference.

One suitable composition for the n-type contact 14 is titanium-aluminum. The titanium-aluminum n-type contact 14 may be alloyed or may contain a titanium-rich composition in contact with the n-GaN substrate 4 and an aluminum-rich composition in contact with the titanium-rich layer. Alternatively, the n-type contact 14 may be formed using at least one of Al, Sc, Ti, Zr, Mo, Ta, W, Ni, Cu, Ag, Au, Pd, Pt, Hf, a rare earth metal, and mixtures thereof. The contacts 14, 16 may be deposited by any means known in the art. Preferred methods for the deposition of the metal contacts 14, 16 include sputter-deposition, thermal evaporation, or e-beam evaporation. The metal contacts 14, 16 will perform best as ohmic contacts if annealed to a temperature between about 400° C. and 950° C.

Optionally, to aid in separation of the wafer into individual LED dies and to improve device lifetime, a mesa is etched through the device structure around the periphery of the device and a passivation layer 18 deposited on the lateral surfaces of the mesa. The passivation layer may comprise $SiO_2$ or $SiN_x$ and may be deposited by thermal evaporation, e-beam evaporation, sputtering, chemical vapor deposition, plasma-enhanced chemical vapor deposition, or the like.

The dislocation density and presence or absence of tilt boundaries in each of the epitaxial layers, including the active layer, cladding layers, contact layers, etc., are expected to mirror the properties of the substrate. Due to the substantial absence of tilt boundaries and the low dislocation density of the substrate, the homoepitaxial light-emitting device is substantially free of tilt boundaries and, for a device area up to about $10^4$ μm$^2$, or up to about $9 \times 10^4$ μm$^2$, or up to 1 mm$^2$, most devices are substantially free of threading dislocations.

With reference to FIG. 2, an alternative embodiment of a homoepitaxial LED structure 2 of the present invention is shown. While a vertical LED structure (FIG. 1) makes more efficient use of substrate area, a lateral configuration with two topside contacts is advantageous in some applications, for example, flip-chip bonding. Flip chip bonding permits more efficient heat extraction from the light-emitting device, thus improving operation at high power. In this embodiment the GaN substrate 4 may be n-type, semi-insulating, or p-type, although for purposes of illustration only the substrate is assumed to be n-type. An n-contact layer 20 comprising n-GaN or n-$Al_uIn_vGa_{1-u-v}N$, where $0 \leq u$, v, $u+v \leq 1$, is deposited on the substrate followed by, optionally, one or more n-$Al_uIn_vGa_{1-u-v}N$ cladding layers 6. Active layer 8, comprising $Al_wIn_xGa_{1-w-x}N$, where $0 \leq w$, x, $w+x \leq 1$ and, preferably, at least one of w and x are nonzero, is then deposited. As above, the active layer may comprise a double heterostructure, a single quantum well, or a $Al_cIn_dGa_{1-c-d}N/Al_eIn_fGa_{1-e-f}N$ multiple quantum well, where $0 \leq c$, d, e, f $c+d$, $e+f \leq 1$. Next to be deposited, optionally, are one or more p-GaN or p-$Al_yIn_zGa_{1-y-z}N$, wherein $0 \leq y$, z, $y+z \leq 1$, cladding layers 10 and a p-GaN or p-$Al_yIn_zGa_{1-y-z}N$ p-contact layer 12. A mesa is then etched through a portion of the layers so as to expose a portion of the n-contact layer 20. The n-electrode 14 and p-electrode 16 are then deposited as described above and, optionally, passivation layer 18 is applied to the exposed mesa.

In one embodiment, the substrate is doped with at least one luminescent atom or color center such as, for example, at least one of a transition or rare-earth metal such as Ti, V, Cr, Mn, Fe, Co, Ni, Zr, Hf, Pr, Eu, Er, or Tm. In another embodiment, a homoepitaxial layer of GaN containing at least one luminescent atom or color center is deposited on the gallium nitride substrate, the active layer, one of the cladding layers, or on the backside of the substrate. The homoepitaxial layer is deposited by methods that are well known in the art, such as molecular beam epitaxy or metal organic chemical vapor deposition. The dopant or color center is preferably present at a concentration of at least $10^{17}$ cm$^{-3}$ and emits or produces luminescence at at least one wavelength between 300 and 1000 nm. In this embodiment, a portion of the light emitted by the active layer is absorbed by the at least one luminescent atom or color center in the substrate, producing an electronically excited state. The excited state then relaxes, emitting light of a different color. In this way the light emitting diode can emit light at two or more different wavelengths without the use of a separate phosphor. For example, red-luminescing GaN crystals can be synthesized by doping with Eu. Combination of blue, blue-green, or green light emitted by the active layer of the light emitting diode and red, orange, yellow, and/or green light emitted by the substrate can produce white light. In another embodiment, luminescence is provided by a second substrate that is wafer-bonded to the backside of the gallium nitride substrate by methods that are well known in the art. Examples of such a second substrate include ruby (Ti-doped sapphire) and cerium-doped yttrium aluminum garnet.

After completion of the device structure, individual devices on a wafer may be separated by slicing, cleaving, or the like. The light extraction efficiency may be improved by shaping or texturing the GaN substrate to decrease the fraction of low-incident angle internal reflections by methods that are known in the art.

In one embodiment, at least some portion of the $Al_uIn_vGa_{1-u-v}N$, where $0 \leq u$, v, $u+v \leq 1$, active or other epitaxial layers are grown selectively on the GaN substrate. Portions of the GaN substrate are masked by selective deposition of at least one dielectric or chemically inert layer, which is in turn patterned by standard lithographic techniques, and then growth of $Al_uIn_vGa_{1-u-v}N$ is performed on the unmasked regions of the substrate. The dielectric layer may comprise at least one of $SiO_2$, $SiN_x$, Si, SiC, ZnO, $TiO_2$, TiN, $TaO_x$, and TaN, and may deposited by sputter deposition, e-beam evaporation, plasma enhanced CVD, or the like. Additional embodiments are described in U.S. patent application Ser. No. 10/686,136, entitled "Monolithic Light Emitting Devices based on Wide Bandgap Semiconductor Nanostructures and Methods for Making Same" by Azar Alizadeh et al., which is hereby incorporated by reference in its entirety.

In one embodiment, strongly optically absorbing or black GaN is employed as the substrate. While such a substrate would absorb a high fraction of the emitted light from the active layer, it would produce little or no luminescence which might otherwise mix with the light output from the active layer. For example, light from a UV LED with an emission wavelength shorter than about 360 nm would normally excite band-edge luminescence from the substrate. With a black substrate the band-edge luminescence would be eliminated. This could be advantageous in applications where the UV light was used to excite luminescence from analytes at low concentrations. Luminescence from the substrate would normally constitute a background signal in such applications, and the use of a black substrate would therefore increase the sensitivity of the technique. In one embodiment, the ratio of the intensity of band-edge photoluminescence, excited by a 266-nm laser, from a black GaN substrate to that of a transparent or near-transparent, undoped GaN substrate is less than 1%; in a preferred embodiment the ratio is less than 0.1%. In one embodiment the ratio of the intensity of band-edge, near-band-edge, and deep-level emission from the substrate of a homoepitaxial light emitting device to the intensity of the emission from the active layer at a wavelength shorter than 360 nm is less than 1%; in a preferred embodiment it is less than 0.1%, and in a still more preferred embodiment it is less than 0.01%.

Figure 8:
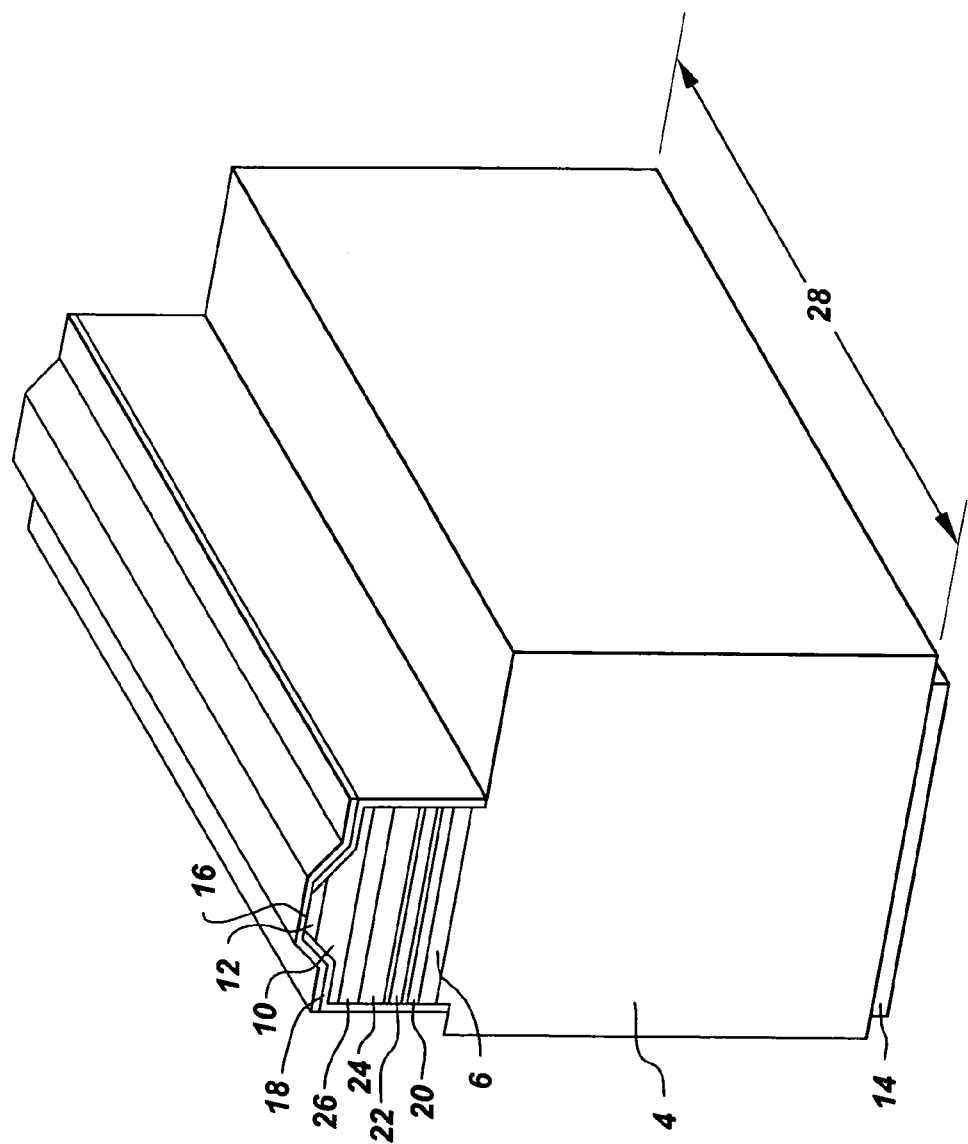
FIG. 8 is a detailed schematic illustration showing the ridge structure of an exemplary homoepitaxial laser diode device of the present invention.

A schematic illustration of a homoepitaxial laser diode device structure 2 of the present invention is shown in a side view (FIG. 3) and in perspective (FIG. 8). In FIG. 8, the long dimension of the device is out of the plane of the page and the short dimensions lie in the plane of the page. The initial steps in the formation of a laser diode device 2 are the same as those of forming the light emitting diode device 2 as described above. FIG. 3 shows a laser diode including many of the optional components discussed with reference to FIG. 1. Specifically, the laser diode 2 comprises a n-GaN substrate 4 upon which the LD semiconductor device is disposed. For illustration purposes, a vertically oriented device is shown in FIG. 3. A laterally oriented device analogous to the device shown in FIG. 2 is also within the scope of the present invention.

The first layer disposed on the n-GaN substrate 4 in FIG. 3 is an n-type cladding layer of the structure $n-Al_aIn_bGa_{1-a-b}N$ 6, followed by an optional $n-Al_cIn_dGa_{1-c-d}N$ light-guiding layer 20, where $0 \leq a$, b, c, d, a+b, $c+d \leq 1$. Cladding layer 6 may comprise a $n-Al_aIn_bGa_{1-a-b}$ N superlattice. The active layer depicted in FIG. 3 is an $Al_eIn_fGa_{1-e-f}N/Al_gIn_hGa_{1-g-h}N$ multiple quantum well layer 22 of the superlattice structure described above, where $0 \leq e$, f, g, h, e+f, $g+h \leq 1$. Disposed on the active layer 22 is a $Al_iIn_jGa_{1-i-j}$ N blocking layer 24, followed by a $p-Al_kIn_lGa_{1-k-l}N$ light-guiding layer 26 and a $p-Al_mIn_nGa_{1-m-n}N$ cladding layer 10, where $0 \leq i$, j, k, l, m, n, i+j, k+l, $m+n \leq 1$. In one embodiment, cladding layer 10 comprises a $p-Al_mIn_nGa_{1-m-n}N$ superlattice. In a preferred embodiment, each of cladding layers 6 and 10, light-guiding layers 20 and 26, and p-type blocking layer 24 have a bandgap greater than that of active layer 22. In a preferred embodiment, optical guiding layers 20 and 26 have bandgap that is smaller than that of cladding layers 6 and 10, and p-type blocking layer 24 has a bandgap that is greater than those of cladding layers 6 and 10. The final layer is an optional $p-Al_oIn_pGa_{1-o-p}N$ contact layer 12 which has a bandgap larger than that of active region 22 but smaller than that of cladding layer 10, where $0 \leq o$, p, $o+p \leq 1$. As described above, the contact layer 12 may alternatively comprise at least one of a $p^+-Al_yIn_zGa_{1-y-z}N$ superlattice, a $p^+-Al_yIn_zGa_{1-y-z}N$-to-$n^+-Al_yIn_zGa_{1-y-z}N$ tunnel junction, where $0 \leq y$, z, $y+z \leq 1$, and at least one metal oxide $MO_x$, where $0 < x \leq 2$ and the metal M comprises at least one of indium, tin, zinc, gold, silver, copper, and nickel. If a tunnel junction is employed in the contact layer, one or both of the $p^+$ and $n^+$ layers may comprise a superlattice. Superlattices in the contact layer preferably contain short periods, with each individual layer of the superlattice having thickness of less than about 1 nm.

In order to provide lateral confinement of the laser cavity, the p-contact layer, cladding layers, active layer and, optionally, the n-contact layer are etched through the device structure to form a mesa structure. The mesa is sufficiently deep to extend at least below the active layer, and may extend all the way into the uppermost portion of the substrate. The width of the stripe-shaped mesa is between about 2 μm and about 500 μm, or preferably between about 5 μm and about 25 μm. In order to improve the electrical confinement and decrease the threshold current, a ridge structure may be etched through the periphery of the contact layer 12 and into the uppermost cladding layer 10, as shown in FIG. 3. The width of the ridge is between about 1 and about 10 μm, and its boundary is preferably at least 3 μm away from the edge of the stripe mesa, and even more preferably at least 10 μm away from the edge of the stripe mesa in order that any lattice damage associated with formation of the mesa structure may not reduce the efficiency of light emission by the active layer. Normally, the ridge structure will be formed prior to etching of the mesa structure since it is shallower. Etching may be performed using methods that are known in the art, and should be performed in such a way as to minimize damage to the material. Examples of such etching methods include, but are not limited to, high density inductively-coupled plasma (ICP) plasma etching, electron cyclotron resonance (ECR) plasma etching, and chemically assisted ion beam etching (CAIBE).

Following etching to form the stripe mesa and ridge structure, the side surfaces of the mesa and ridge, but not the top of the ridge, are passivated by means of passivation layer 18. The passivation layer may comprise $SiO_2$ or $SiN_x$ and may be deposited by thermal evaporation, e-beam evaporation, sputtering, or the like. Optionally, passivation layer 18 may be deposited after top metallic contact 16.

Next, metallic contacts 14, 16 are formed on the top (p-type) and bottom (n-type) surfaces. A suitable composition for the p-type contact 16 is nickel-gold, either alloyed or with a nickel-rich composition in contact with the p-GaN layer 12 and a gold rich composition in contact with the nickel-rich layer. A suitable composition for the n-type contact 14 is titanium-aluminum, either alloyed or with a titanium-rich composition in contact with the n-GaN substrate 4 and an aluminum-rich composition in contact with the titanium rich layer. The contacts may be deposited by any means known in the art. Preferred methods include sputter-deposition or e-beam evaporation. The contacts will perform best as ohmic contacts if annealed to a temperature between about 400° C. and 950° C.

The final step in preparation of the laser diode device structure is to cut the device in a plane perpendicular to the stripe/ridge structure in order to define the long dimension 28 of the laser cavity, as shown in FIG. 8. The length of the laser structure is between 100 μm and 2000 μm, or preferably between about 400 μm and 1000 μm. The simplest method for forming reflective surfaces on the edges of the device is to cleave the substrate and device structure. The cleaved surfaces are then optionally polished, and finally a reflective film is deposited on the facets to increase the reflectivity. In a preferred embodiment, the device structures are grown such that the short (facet) dimension is parallel to a $(10\bar{1}0)$ plane of the substrate 4. Following the completion of layer deposition, the wafer is cleaved along $(10\bar{1}0)$ planes, which are perpendicular to the (0001) growth direction and cleave readily. In an alternative embodiment, the laser facets are prepared by reactive ion etching, ICP, ECR, CAIBE, or a similar dry etch method. If desired to improve the surface finish, the facets can be mechanically polished by standard metallographic methods. In a preferred embodiment, a reflective coating on the facets comprises a distributed Bragg reflector (DBR), which comprises several layers of alternating refractive index. Suitable compositions for the DBR include $TiO_2/SiO_2$ for wavelengths greater than about 390 nm, $ZrO_2/SiO_2$ for radiation wavelengths greater than about 300 nm, or $HfO_2/SiO_2$ for wavelengths greater than about 230 nm, wherein the product of the thickness and index of refraction of each layer is an odd multiple of $\lambda/4$, preferably equal to $\lambda/4$, where $\lambda$ is the wavelength of desired operation of the laser diode. The number of layers in the DBRs are chosen so that the reflectivity of the rear facet is greater than about 0.95 and the reflectivity of the front facet is between about 0.1 and about 0.5.

In each of the embodiments described in FIGS. 1–3, the substrate has been described as n-type. However, in other embodiments, the substrate is p-type and the n- and p-contact layers and the n- and p-cladding layers, respectively, are reversed.

In another embodiment, the substrate for the light emitting device is removed after deposition of at least one GaN or $Al_uIn_vGa_{1-u-v}N$ epitaxial layer, where $0 \leq u, v, u+v \leq 1$ and prior to final packaging. Removal of the substrate may be advantageous for improved heat removal or light extraction or to minimize or eliminate undesirable absorption of the light output or of luminescence from the substrate. For example, the output of UV LEDs that emit light at wavelengths above the bandgap of GaN at approximately 365 nm would be absorbed by the substrate if it were still present in the final device. By removing the substrate and controlling the composition of the other epitaxial layers to maintain an absorption edge at a shorter wavelength than the emission wavelength of the active layer, strong absorption of the emitted light could be avoided. In addition, no substrate luminescence would mix with the output light from the active layer. Extraction of light may be enhanced by removal of the substrate and deposition of a reflective metal electrode or a dielectric mirror such as a distributed Bragg reflector. Removal of heat from the light-emitting device may be enhanced by wafer bonding the device to a thermally-conductive substrate, such as copper, without the original GaN substrate intervening. The substrate may be removed by a number of methods that are known in the art, including lapping, polishing, chemical etching, plasma etching, ion beam etching, and the like. After removal of the substrate, the exposed surface of the device may be passivated, for example, by deposition of either $SiO_2$ or $SiN_x$; metallized with an n- or p-contact; coated with a reflective surface; and/or it may be wafer bonded to a new substrate.

The invention has been described with reference to the preferred embodiment. Obviously, modifications and alterations will occur to others upon reading and understanding the preceding, detailed description. For example, while the detailed description is directed to a vertical device having top and bottom electrical contacts, an insulating or semi-insulating substrate could be used in conjunction with "side" contacts. It is intended that the invention be construed as including all such modifications and alterations insofar as they come within the scope of the appended claims or the equivalents thereof.

The invention claimed is:

1. A light emitting device comprised of a light emitting semiconductor active region disposed on a single crystal substrate comprised of GaN, wherein each of said active region and said substrate has a dislocation density of less than about $10^4$ per $cm^2$ and are substantially free of crystallographic tilt boundaries, and wherein said substrate is removable from said active region and has an optical absorption coefficient below about 100 $cm^{-1}$ at wavelengths between 700 and 465 nm.

2. The light emitting device of claim 1, wherein said dislocation density is less than about $10^3$ per $cm^2$.

3. The light emitting device of claim 1, wherein said dislocation density is less than about 100 per $cm^2$.

4. The light emitting device of claim 1, wherein said substrate is substantially transparent, with an absorption coefficient below about 5 $cm^{-1}$ at wavelengths between 700 and 465 nm.

5. The light emitting device of claim 1, wherein said substrate is n-type and has a carrier mobility above about 100 $cm^2/V\text{-}s$.

6. The light emitting device of claim 1, wherein said substrate has strain below about 0.005%.

7. The light emitting device of claim 1 wherein said substrate is an n-type substrate and has an electrical resistivity below about 100 $\Omega\text{-}cm$.

8. The light emitting device of claim 7, wherein said substrate has an electrical resistivity below about 10 Ω-cm.

9. The light emitting device of claim 7, wherein said substrate has an electrical resistivity below about 1 Ω-cm.

10. The light emitting device of claim 1, wherein said device has a lateral surface area of at least about 104 μm$^2$ and is substantially dislocation free.

11. The light emitting device of claim 1, wherein said device has a lateral surface area of at least about 9×104 μm$^2$ and is substantially dislocation free.

12. The light emitting device of claim 1, wherein said substrate has a wurtzite structure.

13. The light emitting device of claim 1, wherein said substrate has been prepared from a boule grown in a supercritical solvent at a temperature above about 550° C. and a pressure above about 5 kbar.

14. The light emitting device of claim 1, wherein said substrate has a thickness between about 0.05 and 5 mm.

15. The light emitting device of claim 1, wherein said substrate has a carrier concentration below 1×1019 cm$^{-3}$.

16. The light emitting device of claim 1 wherein said semiconductor active region emits light in the ultraviolet to red range of the electromagnetic spectrum.

17. The light emitting device of claim 1, wherein said light emitting semiconductor active region is of the formula $Al_wIn_xGa_{1-w-x}N$, wherein $0 \leq w, x, w+x \leq 1$.

18. The light emitting device of claim 1, wherein said light emitting semiconductor active region is of the formula $Al_wIn_xGa_{1-w-x}N$, wherein $w<0.05$ and $0.05 \leq x \leq 0.5$.

19. The light emitting device of claim 1, wherein said light emitting semiconductor active region is disposed directly on said substrate.

20. The light emitting device of claim 1, wherein said semiconductor active region is disposed on a (0001) Ga crystallographic face of said substrate.

21. The light emitting device of claim 1, wherein said semiconductor active region is disposed on a one of a (10$\bar{1}$0) crystallographic face and a (11$\bar{2}$0) crystallographic face of said substrate.

22. The light emitting device of claim 1, wherein said semiconductive active layer is selectively grown on the single crystal substrate using a selectively patterned mask comprising at least one of a dielectric layer and a chemically inert layer.

23. The light emitting device of claim 22, wherein said dielectric layer comprises at least one of SiO$^2$, SiN$^x$, Si, SiC, ZnO, TiO$^2$, TiN, TaO$^x$, and TaN.

24. The light emitting device of claim 1, wherein said semiconductor active region comprises a single doped layer having a thickness between about 50 nm and 500 nm.

25. The light emitting device of claim 1, wherein said semiconductor active region comprises a single undoped layer having a thickness between about 1 and 10 nm.

26. The light emitting device of claim 1, wherein said semiconductor active region comprises a plurality of layers forming a multiple quantum well.

27. The light emitting device of claim 26, wherein said multiple quantum well comprises from 2 to about 50 alternating layers, wherein a first alternating layer has composition of $Al_cIn_dGa_{1-c-d}N$ and a second alternating layer has a composition of $Al_eIn_fGa_{1-e-f}N$, wherein $0 \leq c, d, e, f, c+d, e+f \leq 1$, and wherein each individual layer has a thickness between 0.5 nm and 50 nm.

28. The light emitting device of claim 1, wherein a first cladding layer of semiconductor material is disposed on a side of said semiconductor active region opposite said substrate.

29. The light emitting device of claim 28, wherein said first cladding layer comprises $Al_yIn_zGa_{1-y-z}N$ and has a larger band gap than the active layer, wherein $0 \leq y, z, y+z \leq 1$.

30. The light emitting device of claim 29, further comprising a second cladding layer disposed between said semiconductor active region and said substrate, wherein said second cladding layer comprises one of GaN and $Al_uIn_vGa_{1-u-v}N$ and has a larger band gap than the active layer, wherein $0 \leq u, v, u+v \leq 1$.

31. The light emitting device of claim 30, further comprising additional cladding layers disposed between said semiconductor active region and said substrate, said additional cladding layers each comprising $Al_uIn_vGa_{1-u-v}N$, wherein $0 \leq u, v, u+v \leq 1$.

32. The light emitting device of claim 29, further comprising a p-type contact layer disposed on said first cladding layer.

33. The light emitting device of claim 32, wherein said p-type contact layer comprises p-GaN.

34. The light emitting device of claim 32, wherein a p-type electrode is in electrical contact with said p-type contact layer.

35. The light emitting device of claim 34, wherein said p-type electrode comprises Ni and Au.

36. The light emitting device of claim 1, further comprising an n-type electrode in contact with at least one of said substrate and an n-contact layer disposed on said substrate.

37. The light emitting device of claim 36, wherein said n-type electrode comprises Ti and Al.

38. The light emitting device of claim 1, further including at least one of a luminescent material and a dopant, wherein said at least one of said luminescent material and said dopant is disposed on a surface of said substrate or within said substrate, wherein said at least one of said luminescent material and said dopant produces luminescent light having a wavelength that is different from the wavelength of light produced by said active region.

39. The light emitting device of claim 38, wherein said wavelength of said luminescent light is in a range from about 300 nm to about 1000 nm.

40. The light emitting device as set forth in claim 38, wherein said at least one of said luminescent material and said dopant comprises at least one of Ti, V, Cr, Mn, Fe, Co, a rare earth metal, and combinations thereof.

41. The light emitting device of claim 1, wherein said substrate is removed from said active region.

42. A light emitting device comprised of a light emitting semiconductor active region disposed on a single crystal substrate comprised of GaN, wherein each of said active region and said substrate has a dislocation density of less than about 10$^4$ per cm$^2$ and are substantially free of crystallographic tilt boundaries, and wherein said substrate is removable from said active region and wherein said substrate is substantially black.

43. The light emitting device of claim 42, wherein a ratio of the sum of band-edge emission intensity, near-band-edge emission intensity, and deep-level emission intensity from the substrate to the emission intensity from said active layer at a wavelength shorter than 360 nm is less than about 1%.

44. The light emitting device of claim 43, wherein said ratio is less than about 0.1%.

45. The light emitting device of claim 44, wherein said ratio is less than about 0.01%.

46. A light emitting device, said light emitting device comprising a light emitting semiconductor active region disposed on a single crystal substrate, wherein said substrate comprises GaN having a characteristic absorption peak at about 3175 cm$^{-1}$ with an absorbance per unit thickness of greater than about 0.01 cm$^{-1}$ and wherein each of said active region and said substrate is substantially free of tilt boundaries and has a dislocation density of less than 100 cm$^2$.

47. The light emitting device of claim 46, wherein said substrate has a fluorine concentration of greater than about 0.04 ppm.

48. A light emitting device, said light emitting device comprising a light emitting semiconductor active region disposed on a single crystal substrate, wherein said substrate comprises GaN having a fluorine concentration of greater than about 0.04 ppm, and wherein each of said active region and said substrate are substantially free of tilt boundaries and have a dislocation density of less than 100 cm$^{-2}$.

49. A light emitting device comprising at least one homoepitaxial light emitting diode, the homoepitaxial light emitting diode comprising:
   a. an n-electrode;
   b. a removable single crystal n-GaN substrate having a dislocation density less than about 10$^4$ per cm$^2$, wherein said substrate is substantially free of crystallographic tilt boundaries and has an optical absorption coefficient below about 100 cm$^{-1}$ at wavelengths between 700 and 465 nm,
   c. an Al$_w$In$_x$Ga$_{1-w-x}$N active layer, wherein said active layer has a dislocation density less than about 10$^4$ per cm$^2$ and is substantially free of crystallographic tilt boundaries;
   d. at least one cladding layer, the cladding layer comprising one of p-GaN and Al$_y$In$_z$Ga$_{1-y-z}$N, wherein said cladding layer has a dislocation density less than about 10$^4$ per cm$^2$ and is substantially free of crystallographic tilt boundaries; and
   e. a p-electrode,
wherein $0 \leq x, y, z, w+x, y+z \leq 1$, wherein the band gap of the active layer is less than that of the cladding layers.

50. The light emitting device of claim 49, wherein the at least one homoepitaxial light emitting diode further comprises at least one n-type cladding layer, wherein the at least one n-type cladding layer comprises Al$_u$In$_v$Ga$_{1-u-v}$N, wherein $0 \leq u, v, u+v \leq 1$.

51. The light emitting device of claim 49, wherein said substrate is removed from the active layer.

52. A laser device comprising at least one homoepitaxial laser diode, the homoepitaxial laser diode comprising:
   a. an n-electrode;
   b. a removable single crystal n-GaN substrate having a dislocation density less than about 10$^4$ per cm$^2$, wherein said substrate is substantially free of crystallographic tilt boundaries and has an optical absorption coefficient below about 100 cm$^{-1}$ at wavelengths between 700 and 465 nm;
   c. an Al$_c$In$_d$Ga$_{1-c-d}$N/Al$_e$In$_f$Ga$_{1-e-f}$N multiple quantum well layer, wherein said quantum well layer is substantially free of crystallographic tilt boundaries;
   d. at least one cladding layer, the cladding layer comprising one of p-GaN or p-Al$_g$In$_h$Ga$_{1-g-h}$N, wherein said cladding layer has a dislocation density less than about 10$^4$ per cm$^2$ and is substantially free of crystallographic tilt boundaries;
   e. a p-type electrode; and
   f. a reflective surface on at least one edge of the homoepitaxial laser diode, wherein the reflective surface comprises a facet formed by cleaving along a (10$\bar{1}$0) crystallographic plane of the substrate, the multiple quantum well layer, and the at least one cladding layer,
wherein $0 \leq c, d, e, f, g, h, c+d, e+f, g+h \leq 1$, wherein the band gap of the multiple quantum well active layer is less than that of the cladding layers.

53. The laser device of claim 52, wherein the at least one homoepitaxial laser diode further comprises at least one cladding layer, the at least one cladding layer comprising one of n-GaN and Al$_a$In$_b$Ga$_{1-a-b}$N, wherein $0 \leq a, b, a+b \leq 1$.

54. The laser device of claim 52, wherein said substrate has at least one absorption peak in the range from about 3050 cm$^{-1}$ to about 3300 cm$^{-1}$ in the infrared spectrum and an optical absorption coefficient below about 100 cm$^{-1}$ at wavelengths between 700 and 465 nm.

* * * * *